(12) United States Patent
Okita et al.

(10) Patent No.: US 8,303,765 B2
(45) Date of Patent: Nov. 6, 2012

(54) PLASMA ETCHING APPARATUS

(75) Inventors: Shogo Okita, Hyogo (JP); Syouzou Watanabe, Osaka (JP); Hiroyuki Suzuki, Osaka (JP); Ryuuzou Houtin, Osaka (JP)

(73) Assignee: Panasonic Corporation, Osaka (JP)

( * ) Notice: Subject to any disclaimer, the term of this patent is extended or adjusted under 35 U.S.C. 154(b) by 557 days.

(21) Appl. No.: 12/593,381

(22) PCT Filed: Mar. 28, 2008

(86) PCT No.: PCT/JP2008/000786
§ 371 (c)(1),
(2), (4) Date: Oct. 22, 2009

(87) PCT Pub. No.: WO2008/129844
PCT Pub. Date: Oct. 30, 2008

(65) Prior Publication Data
US 2010/0096088 A1    Apr. 22, 2010

(30) Foreign Application Priority Data

Mar. 28, 2007 (JP) ................................. 2007-084070
Mar. 28, 2007 (JP) ................................. 2007-084071
Feb. 29, 2008 (JP) ................................. 2008-051233

(51) Int. Cl.
*C23C 16/00* (2006.01)
*H01L 21/306* (2006.01)
(52) U.S. Cl. ........... 156/345.48; 118/723 I; 118/723 AN
(58) Field of Classification Search ................ 118/723 I, 118/723 IR, 723 AN; 156/345.48, 345.49; 315/111.51
See application file for complete search history.

(56) References Cited

U.S. PATENT DOCUMENTS

| | | | | |
|---|---|---|---|---|
| 5,397,962 A | * | 3/1995 | Moslehi | 315/111.51 |
| 5,401,350 A | * | 3/1995 | Patrick et al. | 156/345.48 |
| 5,907,221 A | * | 5/1999 | Sato et al. | 315/111.51 |
| 6,150,763 A | * | 11/2000 | Leou et al. | 315/111.51 |
| 2006/0175016 A1 | | 8/2006 | Edamura et al. | |

FOREIGN PATENT DOCUMENTS

JP     9-246240     9/1997
(Continued)

OTHER PUBLICATIONS

International Preliminary Report on Patentability issued Oct. 20, 2009 in International (PCT) Application No. PCT/JP2008/000786 (in English).

(Continued)

*Primary Examiner* — Luz L. Alejandro
(74) *Attorney, Agent, or Firm* — Wenderoth, Lind & Ponack, L.L.P.

(57) ABSTRACT

A plasma etching apparatus includes a pressure-reducible chamber 1, a placement section 3 for supporting an object to be treated within the chamber 1, a dielectric member 5 for sealing an upper opening of the chamber 1, and a coil 4 provided outside the dielectric member 5. The coil 4 generates a plasma 6 in the chamber 1 by inductive coupling so that the object 2 is subjected to etching. The dielectric member 5 has recess portions 5c discontinuous to one another. Portions of the dielectric member 5 form large-thickness portions 5b. A thickness of the dielectric member 5 in the recess portions 5c is smaller than a thickness of the large-thickness portions 5b. The recess portions 5c are placed according to distribution densities of conductors constituting the coil 4.

18 Claims, 21 Drawing Sheets

FOREIGN PATENT DOCUMENTS

| | | |
|---|---|---|
| JP | 10-27782 | 1/1998 |
| JP | 2000-200698 | 7/2000 |
| JP | 2004-14262 | 1/2004 |
| JP | 2006-186222 | 7/2006 |
| JP | 2006-216903 | 8/2006 |
| WO | 2006/070564 | 7/2006 |

OTHER PUBLICATIONS

International Search Report issued Jun. 24, 2008 in International (PCT) Application No. PCT/JP2008/000786.

English Abstract of KR 1020070089711, Aug. 2007.

* cited by examiner

PLASMA ETCHING APPARATUS

BACKGROUND OF THE INVENTION

1. Technical Field

The present invention relates to plasma etching apparatuses. More specifically, the invention relates to a plasma etching apparatus including an electrode for generating plasma of a reactant gas in a chamber by inductive coupling or by inductive coupling and capacitive coupling via a high-withstand-pressure dielectric member so as to fulfill etching.

2. Background Art

Such plasma etching apparatuses are already known (see, e.g., Patent Literatures 1 to 3).

An apparatus disclosed in Patent Literature 1 includes a metallic beam or frame body with a plurality of through windows formed therein, and a dielectric supported by the frame body to seal the chamber. Patent Literature 1 teaches as follows. With this construction, the dielectric can be reduced in thickness to thereby reduce dielectric loss, while enough pressure strength can be secured by support using a metallic beam or frame body. As a result, it becomes possible to generate high-density plasma over a large area under high vacuum by inductive coupling from the coil or the like. Thus, low-priced plasma processing excellent in durability and electrical efficiency of applied power is realized.

The apparatus disclosed in Patent Literature 2 includes a dielectric member of honeycomb construction in which a plate-shaped portion and a single beam or plurality of beams are integrated together. This dielectric member is placed directly on an upper opening of the chamber without intervention of the frame body. Patent Literature 2 teaches that enough planar strength can be secured by the dielectric member itself by virtue of the honeycomb construction while loss or interception of radio frequency waves from the coil can be solved by eliminating the metallic frame body.

The apparatus disclosed in Patent Literature 3 includes a top plate which is made from a dielectric and in which a recess portion is formed in at least one of its chamber-side surface and its counter-side surface. A thickness of the top plate in this recess portion is smaller than a thickness of the top plate in the other portion. More specifically, the thickness of the top plate in the recess portion is set to one half or less of a wavelength at which the radio frequency wave propagates through the top plate. Patent Literature 3 teaches as follows. The top plate is enabled to secure enough mechanical strength by its having a thicker portion as well as a thin portion. Also, while a radio frequency wave passes through the recess portion, its components directed sideways are reflected by a side wall of the recess portion, thus making the downward directivity intensified. When the recess portion is formed in the surface counter to the chamber, the plasma generation surface is not kept away from an object to be treated so that the directivity can be enhanced. As a result of directivity enhancement, plasma or radicals in vicinities of the object are improved in terms of density.

Patent Literature 1: JP H10-27782 A
Patent Literature 2: JP 2000-200698 A
Patent Literature 3: JP 2004-14262 A The apparatus disclosed in Patent Literature 1 necessitates a beam or frame body other than the dielectric, thus being complex in structure and high-priced in component manufacture and assembling costs. Also, the metallic beam or frame body is located near a plasma generation site so as to be exposed to high-density plasma. The beam, which is made of such a metal as aluminum or stainless steel, is liable particularly to occurrence of metal contaminations. Furthermore, if reaction products generated by plasma etching are deposited onto the beam or frame body during mass production of wafers, the presence of recesses and protrusions formed by the beam or frame body on the chamber inner wall side causes the deposited reaction products to be more likely peeled off, making particles generated, so that the maintenance cycle becomes shorter.

The apparatuses disclosed in Patent Literatures 2 and 3 are generally common to each other in that the mechanical strength is secured by a simple beam structure in which a thin portion and a thick portion of the dielectric are integrally formed, and that the thin portion provided in the dielectric allows radio frequency waves or the like to pass therethrough. The apparatus disclosed in Patent Literature 2 adopts a construction that a coil turned and expanded from a center to peripheries passes through all grid-like beams. This construction allows the whole coil to be placed at a lower position, i.e., closer to a lower surface of the dielectric without influences of the beams. Accordingly, the apparatus is advantageous for loss or interception of radio frequency waves with respect to any portion of the coil, but structure and assembly of the apparatus are complex and expensive.

On the other hand, a semiconductor wafer, which is a treated object of plasma processing, has been increasing in diameter more and more, as large as 200 mm to 300 mm at the present time, while the chamber for treating the wafer has been further increasing in inner diameter, as large as 320 mm to 450 mm. Still more, etching has been attaining higher precision while the etching depth has also been increasing. In order to meet these requirements, there is a need for generating plasma more uniformly and more vigorously over a wide area.

Another problem that matters in some cases is increases in deposition amount of reaction products onto the lower surface of the high-withstand-pressure dielectric member. In particular, in plasma etching of a nonvolatile material, since reaction products and/or nonvolatile materials of sputtering or the like are deposited on the high-withstand-pressure dielectric member, the radio frequency induction electric field or inductive coupling power from the coil is subjected to degradation of transmissivity and/or disturbing of transmission places, causing decreases in plasma density or decreases in plasma uniformity. In contrast to this, in the case where an electrode for capacitive coupling is placed between the high-withstand-pressure dielectric member and the coil in terms of removal or deposition prevention of reaction products, this electrode incurs loss or interception of a radio frequency wave transmitted from the coil through the high-withstand-pressure dielectric member into the chamber, causing a need for avoiding this occurrence.

However, although the apparatus disclosed in Patent Literature 3 has a chamber-sealed structure of low cost and high durability using a high-withstand-pressure dielectric member alone, a construction that allows uniform, vigorous plasma to be generated over a wide area cannot be realized even in combination with the disclosures of Patent Literatures 1, 2. What is more, it is impossible to realize generation of uniform, vigorous plasma over a wide area while the capacitive coupling action from the electrode is utilized for deposition prevention or removal of reaction products.

SUMMARY OF THE INVENTION

An object of the present invention is to provide a plasma etching apparatus which allows uniform, vigorous plasma to be generated over a wide area by the inductive coupling action from the coil with a chamber-sealed structure of low cost and high durability using a high-withstand-pressure dielectric member alone, and moreover which, as required, allows the capacitive coupling action by the electrode to be effectively utilized under a securely obtained plasma generation state.

In order to achieve the above object, in a first aspect of the invention, there is provided a plasma etching apparatus comprising: a chamber which can be depressurized; a placement section which is provided on a lower side of interior of the chamber to hold an object to be treated; a first electrode which is placed so as to face an upper opening of the chamber and to which AC power is applied to transform a reactant gas within the chamber into a plasma by inductive coupling so that an object to be treated held at the placement section is subjected to etching; and a dielectric member placed below the coil so as to seal the upper opening of the chamber, having a plurality of mutually independent recess portions of a first thickness which are formed so as to be located below the coil corresponding to a distribution density of the coil, and having a large-thickness portion of a second thickness larger than the first thickness and continuing except the recess portions. A depth of the recess portions, i.e. a first thickness that is a thickness of the high-withstand-pressure dielectric member at the recess portions, do not necessarily need to be constant if it is set thinner than the second thickness. More specifically, with respect to the individual recess portions, the first thickness may have a distribution, and the first thickness may differ among the recess portions.

According to the characteristics of the first aspect of the invention as described above, the high-withstand-pressure dielectric member, while sealing the upper opening of the chamber by itself alone, forms, at bottoms of the partly independent recess portions, portions smaller in thickness than large-thickness portions adjoining areas other than the small-thickness portions in correspondence to distribution densities of the first electrode so that loss of the radio frequency induction magnetic field or inductive coupling power corresponding to the distribution density from the first electrode can be reduced by an extent of thickness difference from the adjoining large-thickness portions, making it possible to enhance applied power efficiency. Still, by an integral structure integrated with the recess portions so that regions other than the recess portions, having thicknesses larger than the bottom of the recess portions, surround independent recess portions, enough pressure strength of the whole high-withstand-pressure dielectric member can be secured while a small pressure receiving area matching the size of the recess portions is ensured without causing increases in the pressure receiving area due to sealing or floating so that degradation of the pressure strength due to the small thickness at the bottoms of the recess portions is avoided.

Preferably, the plasma etching apparatus further comprises a second electrode which is placed between the first electrode and the dielectric member and in which radio frequency transmission portions formed through in a thicknesswise direction and extending in a direction substantially orthogonal to a longitudinal direction of the first electrode are formed at sites corresponding to the recess portions.

According to this plasma etching apparatus, the second electrode is placed between the high-withstand-pressure dielectric member and the first electrode, and has radio frequency transmission portions which correspond to the recess portions of the high-withstand-pressure dielectric member and which are at least substantially orthogonal to the longitudinal direction of the coil so as to be coincident with directions of stretch of radio frequency induction magnetic fields from the coil while functioning to prevent or remove, by its capacitive coupling action, deposition of reaction products due to plasma generation onto the inner surface side of the high-withstand-pressure dielectric member that seals the chamber, thus not interrupting transmission of the radio frequency induction magnetic field or inductive coupling power from the coil. Thus, necessary level of the applied power efficiency can be secured.

Preferably, the recess portions and the radio frequency transmission portions are placed so as to at least partly overlap with each other in a plan view of the chamber as viewed from the first electrode side.

According to this plasma etching apparatus, since the radio transmission portions are placed as to at least partly overlap with the recess portions in a plan view as viewed from the first electrode side, working areas for the radio frequency induction magnetic field or inductive coupling power transmitted in the thickness direction of the high-withstand-pressure dielectric member can be secured without losing or intercepting the radio frequency induction magnetic field or inductive coupling power from the coil.

Preferably, the recess portions are formed in an upper surface of the high-withstand-pressure dielectric member and the first electrode partly enters into the recess portions, respectively.

According to this plasma etching apparatus, to the extent to which corresponding portions of the first electrode enter into the recess portions, which are provided in the upper surface of the high-withstand-pressure dielectric member so as to be closer to the plasma generation area inside the high-withstand-pressure dielectric member, the transmissivity of the radio frequency induction magnetic field or inductive coupling power from the coil 4 acting on the reactant gas from the coil is enhanced, so that its ratio of electric power in use is increased.

Preferably, when the first electrode is a coil, the recess portions are provided continuous or discontinuous in a direction substantially orthogonal to the longitudinal direction of the coil in portions of the coil having high turn densities, and are placed at least radially from central portion side to peripheral portion side of the high-withstand-pressure dielectric member.

According to this plasma etching apparatus, since the recess portions have a directivity substantially orthogonal to the longitudinal directions of their corresponding coils, the recess portions of the high-withstand-pressure dielectric member are formed in efficient directions with respect to the transmission of the radio frequency induction magnetic field generated in expansion toward the directions substantially orthogonal to the coil 4, enhancing advantageous conditions for securement of strength of the high-withstand-pressure dielectric member without useless expansion, so that transmission loss can be reduced and the applied power efficiency can be enhanced. For this purpose, the range of substantial orthogonality may effectively be set about $\pm 15°$ as an example. In such function, even when an electrode for capacitive coupling is used in combination, the transmission of the radio frequency induction magnetic field is not disturbed by the radio frequency transmission portions substantially orthogonal to the longitudinal direction of the coil corresponding to the recess portions, and moreover by the array of the recess portions and the radio frequency transmission portions substantially orthogonal to the longitudinal direction of the coil, it becomes implementable that the radio frequency induction magnetic field or inductive coupling power from the coil and the capacitive coupling power from the electrode can be distributed to the reactant gas through substantially regular distribution to the longitudinal direction of the coil.

Also, the recess portions directed generally orthogonal to the longitudinal direction of the coil in such placement are provided in multiplicity so as to be arrayed in the circumferential direction and moreover placed at least radially from central portion side to peripheral portion side of the high-withstand-pressure dielectric member. Thus, the large-thickness portions between the recess portions can be enhanced in strength more easily along the deformation direction of the high-withstand-pressure dielectric member.

Preferably, the coil is provided so that a peripheral-portion side annular area or a peripheral-portion side annular area and one or more annular areas on an inner side thereof become high density-distribution areas.

According to this plasma etching apparatus, since the coil has a peripheral-portion side annular area of high density, the coil can be worked from local positions closer to the periphery and effective for the plasma generation area, through the recess portions provided according to the distribution densities, without waste and circumferentially uniformly by proportional distribution corresponding to the array of the recess portions. When the coil has one or more annular areas in addition to the peripheral-portion side annular area, even with weak plasma generation action inside the peripheral-portion side annular area having a large plasma generation area, uniformity of plasma densities can be bettered by the arrangement that high-density coil is provided in one or more central-portion side annular areas independent of the peripheral-portion side annular area.

Preferably, the coil is not branched partway or is branched partway into one line or multiple lines so as to be turned and expanded from central portion side to peripheral portion side of the high-withstand-pressure dielectric member, and has high density-distribution areas in one or more annular areas in a peripheral-portion side annular area or a peripheral-portion side annular area and one or more annular areas on an inner side thereof.

According to this plasma etching apparatus, depending on various modes in which the coil is turned and expanded from the central portion side to the peripheral portion side, the radial distribution density can be changed freely while a substantially equivalent distribution density is obtained in the circumferential direction, so that the coil more easily contributes to uniform plasma generation with high-density portions formed in the radial direction. In addition to this, the recess portions in the direction substantially orthogonal to the longitudinal direction of the coil placed as shown above are provided in multiplicity so as to be arrayed in the circumferential direction, so that the large-thickness portions between the recess portions are more easily enhanced in strength along the deformation direction of the high-withstand-pressure dielectric member.

Preferably, the coil has a large-diameter coil which is not branched partway or is branched partway into one line or multiple lines so as to be turned and expanded from central portion side to peripheral portion side of the high-withstand-pressure dielectric member and forms a higher-density distribution area in the peripheral-portion side annular area, and a small-diameter coil which is not branched partway or is branched partway into one line or multiple lines so as to be turned and expanded from central portion side to peripheral portion side of the high-withstand-pressure dielectric member and has a higher-density distribution area in one central-portion side annular area inward of the peripheral-portion side annular area.

According to this plasma etching apparatus, depending on various modes in which the coil is turned and expanded from the central portion side to the peripheral portion side, the radial distribution density can be changed freely while a substantially equivalent distribution density is obtained in the circumferential direction. In particular, when the peripheral-portion side annular area and the central-portion side annular area are formed by the large-diameter coil and the small-diameter coil, respectively, the degree of freedom for changes in the distribution density is further enhanced, so that the coil more easily contributes to uniform plasma generation with high-density portions formed in the radial direction. In addition to this, the recess portions in the direction substantially orthogonal to the longitudinal direction of the coil placed as shown above are provided in multiplicity so as to be arrayed in the circumferential direction, so that the large-thickness portions between the recess portions are more easily enhanced in strength along the deformation direction of the high-withstand-pressure dielectric member.

Preferably, electric power is applied to the large-diameter coil and the small-diameter coil through a common central support shaft.

According to this plasma etching apparatus, in addition to the eighth aspect of the invention, the coil is provided in two divisional coils. An application point as well as its vicinities of the radio frequency induction magnetic field or inductive coupling power from the coil involve high applied pressure, so that a plasma generated in the chamber and the high applied voltage of the application point are capacitively coupled together, causing more occurrence of cutting or shaving on the high-withstand-pressure dielectric member as well as wear and tear of the high-withstand-pressure dielectric member due to the application point of high applied voltage. Therefore, for the application of the radio frequency power, the coil is supported by the three-dimensional common central support shaft so that the radio frequency application point is away from the high-withstand-pressure dielectric member, so that both support and power application are stabilized while the necessary structure is simplified.

Preferably, AC power is applied to the coil from a central side, and a lower-density distribution area on the central portion side of the coil is away from the high-withstand-pressure dielectric member more than the higher-density distribution area.

According to this plasma etching apparatus, local high density distribution areas of the coil are kept effectively working from positions proximate to the high-withstand-pressure dielectric member, while low-density distribution areas positioned on the application point side on the central side of high applied voltage are away from the high-withstand-pressure dielectric member more than the high density distribution area. Then, by the high applied voltage of the application point as well as its vicinities of the radio frequency induction magnetic field or inductive coupling power from the coil, a plasma generated in the chamber and the high applied voltage of the application point are capacitively coupled together, suppressing more occurrence of cutting or shaving on the high-withstand-pressure dielectric member and the resultant wear and tear of the high-withstand-pressure dielectric member.

In a second aspect of the invention, there is provided a plasma etching apparatus comprising: a chamber which can be depressurized; a placement section which is provided on a lower side of interior of the chamber to hold an object to be treated; a coil which is placed so as to face an upper opening of the chamber and to which AC power is applied to transform a reactant gas within the chamber into a plasma by inductive coupling so that an object to be treated held at the placement section is subjected to etching; and a dielectric member positioned under the coil, wherein the coil has a higher-density distribution area in a peripheral-portion side annular area or a peripheral-portion side annular area and one or more annular areas on an inner side thereof.

These and other objects and characteristics of the present invention will become apparent from the following detailed description and the accompanying drawings. Also, the characteristics of the invention may be adopted singly or in combination within an allowable range.

According to the present invention, the plasma etching apparatus has a simple and low-cost structure in which the high-withstand-pressure dielectric member has partly independent recess portions as a single unit and large-thickness portions adjoining the other areas so as to ensure enough pressure strength and to seal the upper opening of the chamber, while loss of the radio frequency induction magnetic field or inductive coupling power corresponding to the distribution density from the first electrode can be reduced by an extent of thickness difference of bottoms of the recess portions from its surrounding large-thickness portions, making it possible to enhance applied power efficiency. Thus, it becomes possible to realize the uniform plasma generation over a specified area by selection of density distribution of the coil as well as the vigorous plasma generation with low applied power. As a result, the plasma etching apparatus is suitable for high-density, deep etching process while high speed of processing and low cost are obtained.

Further, by providing, as required, a second electrode which is placed between the first electrode and the dielectric member and in which radio frequency transmission portions formed through in a thicknesswise direction and extending in a direction substantially orthogonal to a longitudinal direction of the first electrode are formed at sites corresponding to the recess portions, it becomes achievable to secure enhanced applied power efficiency without interrupting transmission of the radio frequency induction magnetic field or inductive coupling power from the coil at the recess portions of the high-withstand-pressure dielectric member corresponding to the second electrode.

DESCRIPTION OF REFERENCE SIGNS

1: chamber; 2: treated object; 3: placement section, lower electrode 4: coil (for inductive coupling); 5: high-withstandpressure dielectric member 5b: thick wall portion; 5c, 5c1-5c6: recess portion; 6: plasma; 7: electrode (for capacitive coupling); 7a: radio frequency transmission part; and 100: central support shaft

DETAILED DESCRIPTION OF THE INVENTION

Hereinbelow, embodiments of the plasma etching apparatus according to the present invention will be described. However, the following description is given as concrete examples of the invention only and should be construed as not limiting the contents of the appended claims.

First Embodiment

Figure 1:
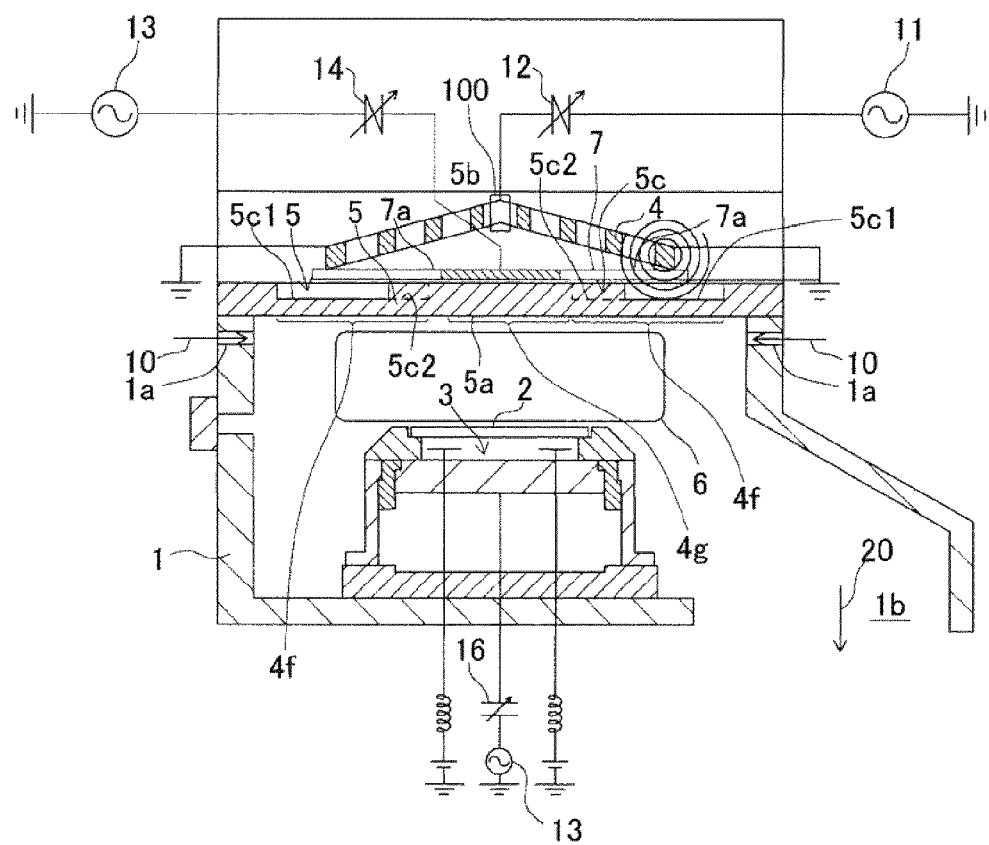
FIG. 1 is a schematic sectional view showing a plasma etching apparatus according to a first embodiment of the present invention.
Figure 2A:
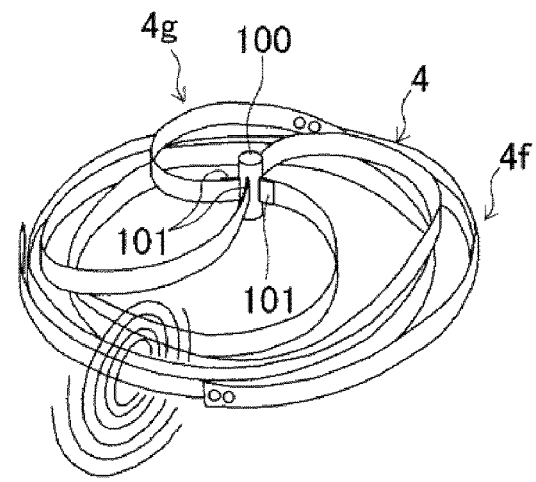
FIG. 2A is an exploded perspective view showing a coil, a high-withstand-pressure dielectric member and an electrode.
Figure 2A:
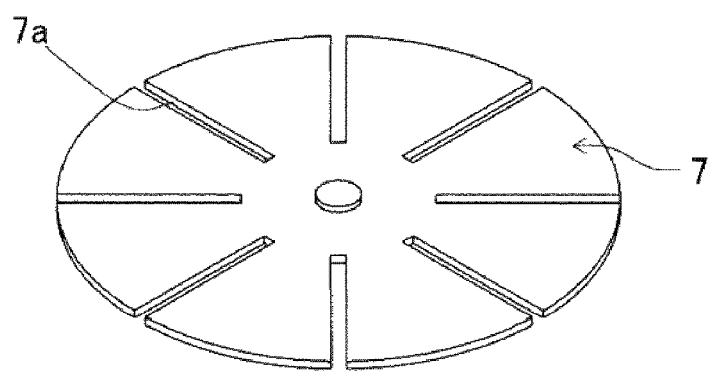
Figure 2A:
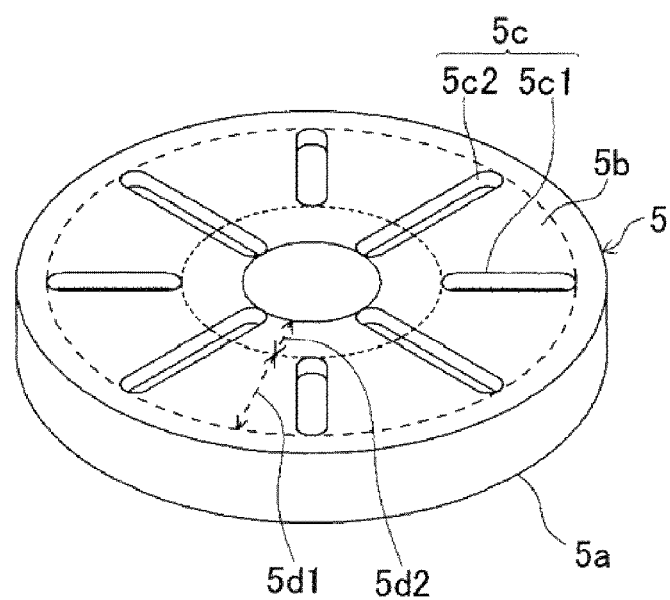
Figure 2B:
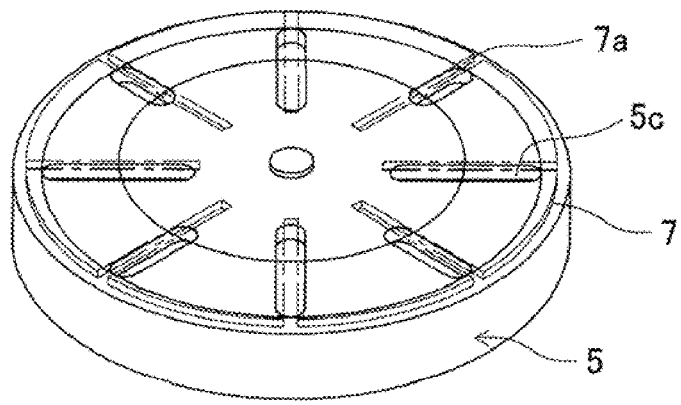
FIG. 2B is a perspective view showing a high-withstand-pressure dielectric member and an electrode.

FIGS. 1 to 2B show a plasma etching apparatus according to a first embodiment of the invention. This plasma etching apparatus includes: a chamber 1 which can be depressurized and which supplies a reactant gas 10 through a supply port 1a and discharges an exhaust gas 20 through an exhaust port 1b; a placement section 3 which is provided on a lower side within the chamber 1 and which holds a placed object 2 to be treated by electrostatic attraction or clamping (not shown) or the like; and a high-withstand-pressure dielectric member 5 which forms a partition wall for sealing the upper opening of the chamber 1. The plasma etching apparatus also includes a coil 4 for inductive coupling which is provided at an upper portion of the high-withstand-pressure dielectric member 5 so as to face the placement section 3 and which transforms the reactant gas 10 within the chamber 1 into a plasma 6 by inductive coupling so that the plasma acts on the object 2 held at the placement section 3 to fulfill plasma processing such as etching on the object. The plasma etching apparatus further includes an electrode 7 for capacitive coupling which is provided between the high-withstand-pressure dielectric member 5 and the coil 4 so as to prevent or remove, by its capacitive coupling action, deposition of reaction products due to plasma generation onto an inner surface 5a of the high-withstand-pressure dielectric member 5 that seals the upper opening of the chamber 1.

The coil 4 is an inductively coupled plasma coil (ICP coil) and radio frequency antenna to generate the plasma 6 in the chamber 1 via the high-withstand-pressure dielectric member 5 so that the plasma 6 acts on the surface of the object 2 on the placement section 3 to fulfill plasma processing such as etching. Also, the electrode 7, which is a Faraday shield electrode (FS electrode) to which an AC power is applied, forms a uniform electric field extending along the inner surface 5a of the high-withstand-pressure dielectric member 5 located on the coil 4 side of the chamber 1 so as to prevent deposition of reaction products caused in the plasma processing. Such problems as foreign matter contamination of the object 2 due to increases in deposition amount of reaction products onto the inner surface 5a formed by the high-withstand-pressure dielectric member 5, and nonuniform cutting or shaving of the high-withstand-pressure dielectric member 5 due to non-uniformity of deposited foreign matter onto the inner surface 5a, are more likely to occur when more vigorous plasma generation with increased applied power is anticipated in response to increases in plasma generation area due to a larger-diameter semiconductor wafer, which is the object 2, enhancement for higher precision of etching process, and increases in etching depth. For these problems, it is effective to use the inductive coupling action by the coil 4 and the capacitive coupling action by the electrode 7 in combination. Increases in the deposition amount of reaction products matter particularly when the object 2 is a nonvolatile material (examples of the nonvolatile material are gold, platinum, iridium or their oxides, compound-containing precious metal materials, ferroelectric materials such as PZT, SBT and STO). More specifically, in plasma etching of an object 2 made of a nonvolatile material, since reaction products and/or nonvolatile materials of sputtering or the like are deposited on the high-withstand-pressure dielectric member, the radio frequency induction field or inductive coupling power from the coil is subjected to degradation of transmissivity and/or disturb of transmission places, so that decreases in plasma density or decreases in plasma uniformity are more likely to occur. In such a problematic case where the object 2 is a nonvolatile material, it becomes more effective to use the inductive coupling action by the coil 4 and the capacitive coupling action by the electrode 7 in combination.

For a high-speed plasma processing process, with a lower electrode provided at the placement section 3, AC power, chiefly radio frequency power, is supplied as a bias power application to the lower electrode from a power source 13 via a capacitor 16 or the like as a matching device so as to make the plasma 6 act on the object 2 side.

To the coil 4 for inductive coupling action, mostly radio frequency power is supplied from a power source 11 via a variable capacitor 12 or the like as a matching device so as to enable plasma processing at a specified etching rate. Also, the coil 4, including its later-detailed three-dimensional placement configuration and the like, is controlled so as to make the plasma 6 generated with a uniform density distribution on the surface of the object 2 so that the surface of the object 2 is plasma-processed uniformly at the set etching rate. The radio frequency power is set commonly to an AC power of about 30 kHz-300 GHz, while the radio frequency range to be applied to plasma generation apparatuses is AC power within a narrow range of about 3-30 MHz, which is commonly designated as HF.

To the electrode 7 for capacitive coupling action, an AC power of high frequencies equivalent to or lower than that of the coil 4 is supplied from a power source 13 via a variable capacitor 14 or the like as a matching device so that deposition of reaction products onto the inner surface 5a of the high-withstand-pressure dielectric member 5 located on the coil 4 side (upper opening side) of the chamber 1 can be prevented and/or removed by adjustment of the variable capacitor 14.

Now a detailed description of the coil 4 will be given below.

With reference to FIGS. 1 and 2A, in this embodiment, a peripheral portion 4f side of the coil 4 is narrow in interval between plate electrodes and hence in a high density distribution, while a central portion 4g side is wider in interval between plate electrodes than on the peripheral portion 4f side and hence in a lower density distribution. The AC power is applied to the central portion 4g of the coil 4 having the lower density distribution. In more detail, the coil 4 is formed of a multiplicity (four) of plate-shaped electrodes (conductors) circularly turned and expanded from central portion 4g side toward peripheral portion 4f side, so that the number of turns, i.e. placement density of the plate electrodes, is higher on the peripheral portion side than on the central portion side. Further, application of the radio frequency power is done through electrode application pieces 101 radially provided at a central support shaft 100, where outer circumferential ends of a plurality of branched coil electrodes are connected to the ground. The coil 4 is so configured, in sideways view, that the peripheral portion 4f side is closer to an upper surface of the high-withstand-pressure dielectric member 5, which seals the upper opening of the chamber, than the central portion 4g side. In other words, the peripheral portion 4f side of the coil 4 is lower in height than the central portion 4g side.

By the arrangement that the coil 4 has placement densities higher on the peripheral portion 4f side than on the central portion 4g side as well as a sideways-viewed configuration lower in height on the peripheral portion 4f side than on the central portion 4g side, inductive coupling power is concentrated to a peripheral annular area within the chamber 1, thereby exciting the reactant gas supplied from the supply port 1a provided at a peripheral-wall upper portion of the chamber 1 as shown by arrows, so that the resultantly generated plasma 6 uniformly reaches the upper surface of the object 2 in the chamber 1. In other words, the coil 4 that is adapted to operate over a large area by being concentrated to the peripheral-side annular area of the chamber 1 is combined with the chamber 1 to which the reactant gas is supplied at least from the side wall on the peripheral-side annular area side, so that the plasma 6 reaches uniformly to the upper surface of the object 2. In more detail, in the chamber 1, the reactant gas supplied from the supply port 1a in the side wall located on the large-area peripheral-side annular area side is given such behavior that the reactant gas, while being injected to the annular area extending along the side wall of the chamber 1, is filled and expanded to the central portion of reduced pressure. Also, the coil 4, on the other hand, gives the concentrated inductive coupling action efficiently and uniformly over a wide area from the proximately located peripheral portion 4f side to the annular reactant-gas injection area by a corresponding extent. Thus, the reactant gas is transformed vigorously and uniformly into a plasma filled to the central portion, so that a uniform, vigorous plasma can be generated over a wider area.

In particular, in this embodiment, since the reactant gas is supplied from the side-wall upper portion of the chamber 1 as shown in FIG. 1, the annular reactant-gas injection area becomes proximate to the coil 4 not only in a planar direction but also in a heightwise direction, allowing the efficiency of inductive coupling action to be further enhanced, so that the reactant gas is filled even to a lower portion in addition to the central portion of the chamber 1 that is pressure-reduced by plasma formation. Accordingly, it is not essential to set the reactant-gas supply port 1a along an up-and-down direction. However, it is preferable that the supply port 1a satisfies a setting condition that the reactant gas in the injection area that is annular-shaped in the circumferential direction of the chamber 1 is of such uniformity as to have neither excesses and deficiencies nor nonuniformities in the circumferential direction.

As described before, the central portion 4g of the coil 4 is lower in density than the peripheral portion 4f and higher in position than the peripheral portion 4f. Then, radio frequency power is applied from the support shaft 100 to the central portion 4g side of the coil 4. In other words, the coil 4 is formed in such a three-dimensional manner as to be low in density at an application point of radio frequency power with the application point away from the high-withstand-pressure dielectric member (plasma generation area of the chamber 1) 5. By this three-dimensional makeup of the coil 4, the plasma generated in the coil 4 and a higher applied voltage on the application point side are capacitively coupled together by higher applied voltages at an application point and its vicinities of the radio frequency induction field or inductive coupling power of the coil 4, thus suppressing wear and tear of the high-withstand-pressure dielectric member 5 due to larger amount of occurrence of cutting or shaving on the high-withstand-pressure dielectric member 5. Thus, it becomes implementable to fulfill high-precision plasma etching in which a generated plasma acts more uniformly on the processed surface of the object 2 and which is free from processing nonuniformities.

The number of turns of the coil 4 may be either in one line or in 2 or more parallel branch lines on its way of a one-step stage or plural-step stages. Its turning configuration may be rectangular-shaped, and its cross-sectional configuration with respect to the longitudinal direction of the electrode of the coil 4 may be given by linear electrodes instead of the plate electrodes.

Now, an explanation of the high-withstand-pressure dielectric member 5 will be given below.

Generally, with a simple structure that the chamber 1 is sealed by the high-withstand-pressure dielectric member 5 alone made of quartz or other like material as in this embodiment, there is a problem that the high-withstand-pressure dielectric member 5 is increased in thickness for increased pressure strength so that transmission loss of the radio frequency induction field or inductive coupling power from the coil 4 via the high-withstand-pressure dielectric member 5 into the chamber 1 is increased, resulting in degradation of the applied power electrical efficiency for the coil 4 as a problem. As a solution to this problem, if a dielectric and beams or a frame body that support the dielectric are used as described in Patent Literature 1, the resulting structure would be complex so as to cause increases in cost as well as increases in the dismantled parts count, assembled parts count and time and labor involved in the maintenance.

Therefore, in this embodiment, in the high-withstand-pressure dielectric member 5 that seals by itself alone the upper opening of the chamber 1, a plurality of recess portions 5c which are discontinuous to or independent of one another are provided in the upper surface of the high-withstand-pressure dielectric member 5 in correspondence to density distributions of the coil 4 as shown most clearly in FIG. 2A so as to enhance the applied power efficiency of the coil 4 without causing decreases in pressure strength, where the other portions are defined as adjoining larger thickness portions 5b. A thickness of the high-withstand-pressure dielectric member 5 in the recess portions 5c is smaller than that of the high-withstand-pressure dielectric member 5 in the large-thickness portions 5b, and a radio frequency induction electromagnetic field generated by the coil 4 passes through a bottom portion of each recess portion 5c, so that the transmissivity of the radio frequency induction electromagnetic field or inductive coupling power from the recess portions 5c is enhanced at the recess portions 5c. The radio frequency induction electromagnetic field or inductive coupling power from the coil 4 corresponds to the distribution density, which is the turn density of the coil 4. That is, the higher the distribution density of the coil 4 becomes, the stronger the radio frequency induction electromagnetic field or inductive coupling power becomes. Therefore, the recess portions 5c are preferably provided at densities corresponding to the distribution densities of the coil 4. More specifically, the recess portions 5c of the high-withstand-pressure dielectric member 5 are preferably placed in larger number or larger area on the peripheral portion 4f side than on the central portion 4g side of the coil 4. With the recess portions 5c provided at densities corresponding to distribution densities of the coil 4, loss of the radio frequency induction field or inductive coupling power acting on the reactant gas 10 within the chamber 1 from the coil 4 via the high-withstand-pressure dielectric member 5, the loss being attributable to the high-withstand-pressure dielectric member 5, is reduced more effectively, so that the applied power efficiency of the AC power for the coil 4 is enhanced.

The adjoining large-thickness portions 5*b* other than the recess portions 5*c* are areas each of which has a thickness larger than a thickness of the bottom of the recess portions 5*c* and which are formed in an integral structure integrated with the recess portions 5*c* so as to surround independent recess portions 5*c*. In other words, the recess portions 5*c* and the large-thickness portions 5*b* are no more than portions of the integral structure (circular-plate shaped in this embodiment) other than the high-withstand-pressure dielectric member 5. Accordingly, between the recess portions 5*c* and the large-thickness portions 5*b*, there is no room for occurrence of the problem of degradation of mechanical strength or durability density due to increases in pressure receiving area caused by sealing or floating or the like, so that a pressure receiving area matching the number and area of the recess portions 5*c* can be secured by the large-thickness portions 5*b*. Thus, by providing the adjoining large-thickness portions 5*b*, enough pressure strength of the whole high-withstand-pressure dielectric member 5 can be secured while the degradation of pressure strength due to smaller thicknesses of the recess portions 5*c* is avoided.

Given that the high-withstand-pressure dielectric member 5 is formed from a natural material such as quartz, the recess portions 5*c* can be easily formed by a boring process, and given that the high-withstand-pressure dielectric member 5 is a molded article, the recess portions 5*c* can be formed in one step during the molding process. Further, the high-withstand-pressure dielectric member 5 is placed directly on the side wall of the chamber 1 without intervention of any other structures such as beams or frame body, thus being simple in structure, good in maintainability and low in cost.

As shown above, the structure that the high-withstand-pressure dielectric member 5 that seals the coil 4 side upper opening of the chamber 1 has mutually independent recess portions 5*c* provided in correspondence to the distribution densities of the coil turn density and large-thickness portions 5*b* adjacent to the other areas is not only capable of securing enough pressure strength with a simple structure, good maintainability and lost cost, but also capable of reducing the loss of the radio frequency induction electric field or radio frequency induction magnetic field or inductive coupling power from the coil 4 corresponding to the distribution densities of turn density of the coil 4 so that the AC power application efficiency can be enhanced. Thus, it becomes possible to realize the uniform plasma generation over a specified area by the coil 4 as well as the vigorous plasma generation with low applied power. As a result, high-density, deep etching process can be realized while high speed of processing and low cost are ensured.

Proper setting of the shape, size and placement of the recess portions 5*c* allows enough pressure strength to be obtained even if the adjoining large-thickness portions 5*b* of the high-withstand-pressure dielectric member 5 are set equal in thickness to a high-withstand-pressure dielectric member having no recesses and protrusions and having a mere plate shape. With a view to reducing the loss of the radio frequency induction electric field or inductive coupling power, the larger depth of the recess portions 5*c* is preferable relative to the thickness of the adjoining large-thickness portions 5*b*. However, the degree of allowance therefor differs depending on the shape pattern, size and array pattern of the recess portions 5*c*.

Now, the relationship between the distribution densities of the coil 4 and the recess portions 5*c* will be explained below.

In this embodiment, as described above, the coil 4 is so placed that plate electrodes are circularly turned and expanded from central to peripheral portions of the high-withstand-pressure dielectric member 5 so that the number of turns, i.e. placement density of the plate electrodes, is higher on the peripheral portion side. Since the distribution of the radio frequency induction field or inductive coupling power is generated so as to be concentrated on the peripheral portion 4*f* side of the coil 4 in correspondence to placement densities, a concentrated placement of the recess portions 5*c* in an annular area 5*d*1 (see FIG. 2B) of the peripheral portion of the high-withstand-pressure dielectric member 5 opposed to the peripheral portion 4*f* side of the coil 4 reduces the loss of the radio frequency induction field or inductive coupling power during the transmission so that the applied power efficiency is enhanced. More specifically, the recess portions 5*c*, extending in directions generally orthogonal to longitudinal directions of the coil 4, are provided so as to be arrayed in multiplicity in the circumferential direction of the high-withstand-pressure dielectric member 5. Further, since the recess portions 5*c* are placed radially in directions from central portion side to peripheral portion side of the high-withstand-pressure dielectric member 5, the large-thickness portions 5*b* between the recess portions 5*c* are increasingly higher in strength along a deformation direction of the high-withstand-pressure dielectric member 5. These characteristics will be explained below.

As shown in FIGS. 1 and 2A, the electromagnetic field from the coil 4 is generated in directions substantially orthogonal to the longitudinal directions of the coil 4 (plate electrodes) on the peripheral side of the coil 4 of narrow intervals between the plate electrodes and a higher-density distribution, then being expanded annularly. In correspondence to this electromagnetic field distribution, the recess portions 5*c* are provided so as to extend in directions substantially orthogonal to the longitudinal directions of the coil 4, thereby enhancing the applied power efficiency. By each recess portion 5*c* having a directivity substantially orthogonal to its corresponding coil 4, transmission loss of the electromagnetic field generated in expansion toward the directions substantially orthogonal to the coil 4 can be reduced and moreover transmission degradation of the radio frequency induction magnetic field or inductive coupling power can be suppressed, so that the applied power efficiency that is required can be enhanced.

A receiving portion located inside the upper opening portion of the chamber 1 substantially supports the high-withstand-pressure dielectric member 5. At the site supported by this receiving portion, a large shearing force is caused particularly by vacuum generation in the chamber 1. In this embodiment, an out-side end portion of the recess portions 5*c* and an inner-side receiving portion of the upper opening are spaced from each other. In other words, the recess portions 5*c* are so constructed as not to reach the receiving portions inside the upper opening of the chamber 1. By this construction, necessary deformation resistance and durability of the high-withstand-pressure dielectric member 5 can be ensured.

Also, since the recess portions 5*c* extend generally in radial directions of the high-withstand-pressure dielectric member 5 and are radially placed, enough pressure strength of the high-withstand-pressure dielectric member 5 can be secured. More specifically, when the peripheral portion of the circular high-withstand-pressure dielectric member 5 is supported by the chamber 1 as in this embodiment, in-plane stress of the high-withstand-pressure dielectric member 5 due to vacuum pressure reception in the chamber 1 increases from central portion toward peripheral portion, where internal stresses at individual radial positions are equalized along the circumferential direction. Since the recess portions 5*c* are radially placed so as to extend from central portion side toward peripheral portion side (receiving portion side by the chamber 1) of the high-withstand-pressure dielectric member 5, circumferential array pitches of the recess portions 5c are wider on the peripheral portion side of the high-withstand-pressure dielectric member 5, where high in-plane stresses act as described above, than on the central portion side, so that enough pressure strength of the high-withstand-pressure dielectric member 5 can be secured. With the recess portions 5c formed into an elliptical-type elongate groove shape as in this embodiment, it becomes possible to make the most of the effect of pressure strength securement by the radial placement of the recess portions 5c extending in radial directions of the high-withstand-pressure dielectric member 5. It is noted that an angular range for the above-mentioned substantial orthogonality may effectively be regarded, for example, as ±15° to the orthogonal angle.

As shown in FIG. 2A, since no recess portions 5c are provided on the central portion side of the high-withstand-pressure dielectric member 5 having wider intervals between the plate electrodes of the coil 4 and lower densities, the need for boring or other machining process to form the recess portions 5c is eliminated, allowing time and labor for machining to be omitted. Besides, omitting the recess portions 5c on the central portion side of the high-withstand-pressure dielectric member 5 like this also allows pressure strength of the whole high-withstand-pressure dielectric member 5 to be enhanced.

Now, the shape, placement and the like of the recess portions 5c in this embodiment will be described in more detail below.

As shown in FIGS. 2A and 2B, the recess portions 5c in this embodiment include two types of recess portions 5c1, 5c2. One recess portion 5c1 has an elongate shape which is radially arranged in a direction from central portion side toward peripheral portion side in one annular area 5d1 located on the peripheral portion side of the high-withstand-pressure dielectric member 5. The other recess portion 5c2 has an elongate shape which is radially arranged in a direction from an annular area 5d2 on the inner circumferential side more than the annular area 5d1 toward the peripheral portion side. In other words, the recess portion 5c1 has an outer-side end portion positioned in the peripheral portion of the high-withstand-pressure dielectric member 5, and an inner-side end portion positioned at a boundary of the annular areas 5d1, 5d2. On the other hand, the recess portion 5c2 has an outer-side end portion positioned in the peripheral portion of the high-withstand-pressure dielectric member 5, and an inner-side end portion positioned within the annular area 5d2. That is, the recess portions 5c in this embodiment are composed of recess portions 5c1 present only in the peripheral annular area 5d1, and the recess portions 5c2 present in both the peripheral annular area 5d1 and the inner-side annular area 5d2. Also, the recess portions 5c1 and the recess portions 5c2 are provided alternately in the circumferential direction. These recess portions 5c1, 5c2 are intended to reduce the transmission loss of the radio frequency induction magnetic field or inductive coupling power of the coil 4 for the interior of the chamber 1 and, thereby, enhance the applied power efficiency. Also, while a degree of reduction of dielectric loss and electrical efficiency improvement by the high-density placement of the elongate recess portions 5c1, 5c2 are achieved, the strength of the whole high-withstand-pressure dielectric member 5 can advantageously be secured by reducing the degree of denseness of the recess portions 5c1, 5c2 particularly in the circumferential direction.

In each of the annular areas 5d1, 5d2, the recess portions 5c1, 5c2 are placed alternately in the circumferential direction. If the array density of the elongate recess portions 5c1, 5c2 is enhanced under a suppressed degree of closeness between the elongate recess portions 5c1, 5c2, the degree of reduction of the dielectric loss and the applied power efficiency can be further enhanced. Further, the recess portions 5c2 extending up to the inner-circumferential side annular area 5d2 are partly overlapped with the recess portions 5c1 in the peripheral annular area 5d1 as viewed from the circumferential direction. With this placement of the recess portions 5c1, 5c2, the array density of the recess portions 5c can be enhanced under a suppressed degree of closeness between the recess portions 5c in the circumferential direction in the inner-circumferential side annular area 5d2, which is smaller in circumferential distance than the outer-side annular area 5d1, so that the degree of reduction of transmission loss of the radio frequency induction magnetic field or inductive coupling power from the coil 4 via the high-withstand-pressure dielectric member 5 into the chamber 1, as well as the applied power efficiency, can be further enhanced. That is, the applied power efficiency is enhanced, and yet it is implemented to suppress degradation of the pressure strength of the high-withstand-pressure dielectric member 5 due to useless densification of the recess portions 5c1, 5c2 and the like in the inner-circumferential side annular area 5d2 which is smaller in circumferential distance than the outer-circumferential side annular area 5d1.

Figure 2C:
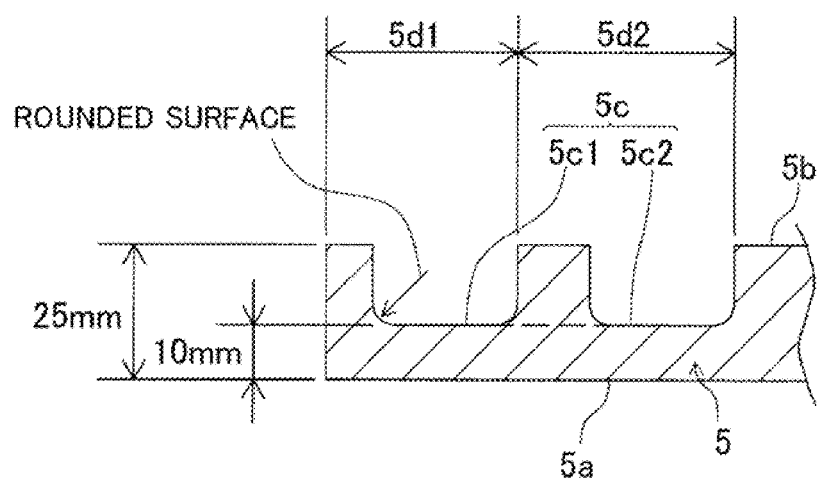
FIG. 2C is a sectional view showing recess portions provided in the high-withstand-pressure dielectric member.
Figure 3:
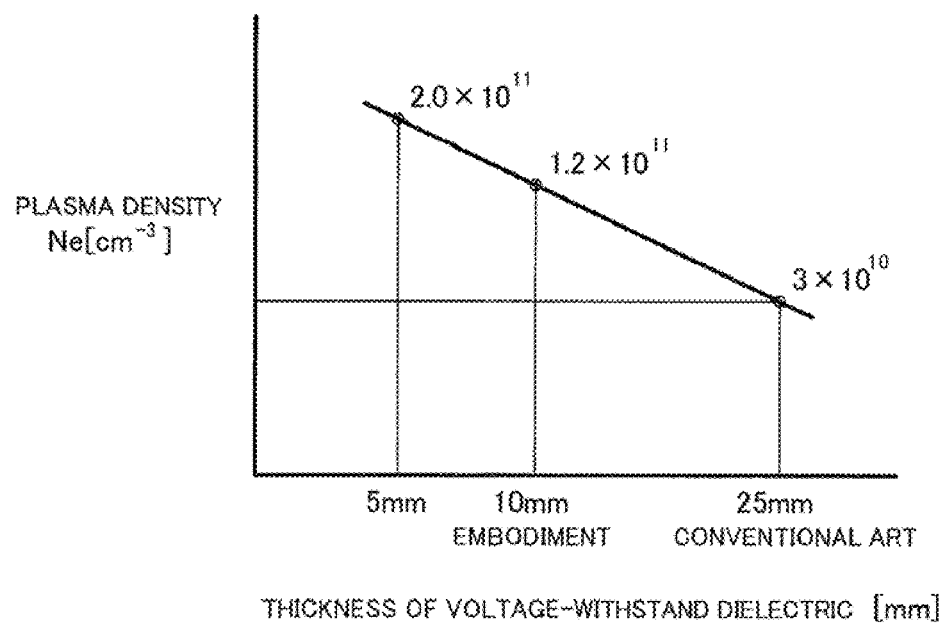
FIG. 3 is a graph showing a correlation between the thickness of the high-withstand-pressure dielectric member and the density of plasma generated by transmission into the chamber against a constant electric power applied to the inductive-coupling electrode (coil)

The reduction effect of transmission loss of the radio frequency induction magnetic field or inductive coupling power in the area field of the recess portions 5c increases in proportion to the degree of thinness of the thickness relative to the large-thickness portions 5b. Therefore, from such point of view, the larger depth of the recess portions 5c is increasingly preferable. However, excessively large depths with excessively thin thicknesses at the recess portions 5c would affect the pressure strength of the high-withstand-pressure dielectric member 5 and its service life to cutting or shaving, and thus the thinness of the recess portions 5c is limited. In this embodiment, as shown in FIG. 2C, under a condition of the thickness of the high-withstand-pressure dielectric member 5 made of quartz, the large-thickness portions 5b are 25 mm thick, while the thickness of the bottom at the recess portions 5c is set to 10 mm so as to provide sufficient pressure strength and cutting life. In more detail, as shown in FIG. 3, from the correlation between the thickness of the high-withstand-pressure dielectric member 5 and the plasma density Ne ($cm^{-3}$) obtained in the chamber 1 against a constant power applied to the coil 4, the plasma density Ne ($cm^{-3}$) is $3 \times 10^{10}$ $cm^{-3}$ for a conventional thickness of 25 mm as an example, while the plasma density becomes $1.2 \times 10^{11}$, which is about a quadruple, for a thickness of 10 mm at the recess portions 5c. It is noted that corner portions at the bottom of the recess portions 5c are surface-rounded as shown in FIG. 2B, by which stress concentration due to angularity is relaxed to reduce adverse effects of the recess portions 5c on the pressure strength of the high-withstand-pressure dielectric member 5. Besides, it is advantageous for pressure resistance to suppress the degree of angularity of the recess portions 5c at proximate portions between the recess portions 5c.

Next, a description on the electrode 7 will be given below.

The electrode 7 positioned between the high-withstand-pressure dielectric member 5 and the coil 4 forms an electrostatic shielding that blocks transmission of the radio frequency induction magnetic field or inductive coupling power from the coil 4. Therefore, such a radio frequency transmission portion 7a as shown in FIG. 2B is formed over at least a range corresponding to the recess portions 5c provided in the high-withstand-pressure dielectric member 5, preferably over a range including an effective working area from the coil 4 in vicinities of the recess portions 5c. In this embodiment, the radio frequency transmission portion 7a is a slit or cutout extending from an outer circumferential edge toward the center of the electrode 7 through in the thicknesswise direction. Instead, the radio frequency transmission portion 7a may be a window portion formed through in the thicknesswise direction. The radio frequency transmission portion 7a extends in a direction substantially orthogonal to the longitudinal direction of the coil 4, the extending direction of the radio frequency transmission portion 7a is coincident with the expanding direction of the electromagnetic field from the coil 4. The recess portions 5c and the radio frequency transmission portion 7a of the electrode 7 at least partly overlap with each other in a plan-view direction of the chamber 1 as viewed from the coil 4 side. Therefore, the recess portions 5c and the radio frequency transmission portion 7a may appropriately be placed so that the recess portions 5c and the radio frequency transmission portion 7a corresponds to each other up and down as shown in FIG. 2B.

The electrode 7, which is located between the high-withstand-pressure dielectric member 5 and the coil 4, is enabled to prevent or remove, by its capacitive coupling action, deposition of reaction products due to plasma generation onto the inner surface 5a of the high-withstand-pressure dielectric member 5. Further, the radio frequency transmission portion 7a is provided in the electrode 7 in correspondence to the recess portions 5c provided in the high-withstand-pressure dielectric member 5 at densities corresponding to distribution densities of the coil 4 (i.e., so as to at least partly overlap with the recess portions 5c in a plan-view direction from the coil 4 side), and the radio frequency transmission portion 7a extends in a direction coincident with the expanding direction of the electromagnetic field from the coil 4. Therefore, the electrode 7 does not interrupt transmission of the electromagnetic field or inductive coupling power from the coil 4, so that high applied power efficiency can be secured. In other words, by the overlapped placement of the recess portions 5c and the radio frequency transmission portions 7a, the working area of the radio frequency induction magnetic field or inductive coupling power transmitted with less loss with respect to the thicknesswise direction of the high-withstand-pressure dielectric member 5 can be secured. Thus, with the radio frequency transmission portions 7a provided in the electrode 7, prevention or removal of reaction products onto the inner surface 5a of the high-withstand-pressure dielectric member 5 by the capacitive coupling action can be realized while the loss of inductively coupled plasma from the coil 4 is suppressed.

FIGS. 4A to 9 show various modifications of the first embodiment.

Figure 4A:
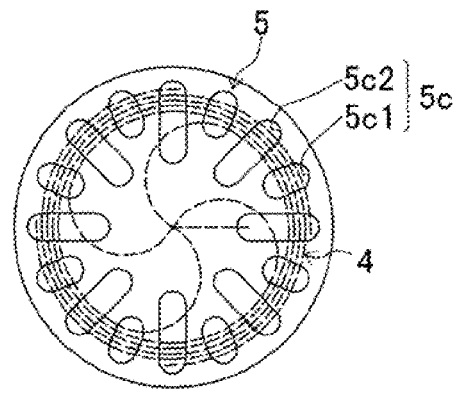
FIG. 4A is a schematic plan view showing a coil and a high-withstand-pressure dielectric member according to a first modification of the first embodiment.
Figure 4B:
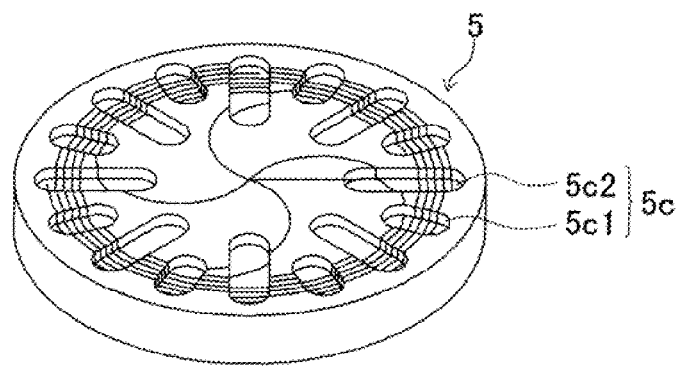
FIG. 4B is a schematic perspective view showing the coil and the high-withstand-pressure dielectric member according to the first modification of the first embodiment.
Figure 4C:
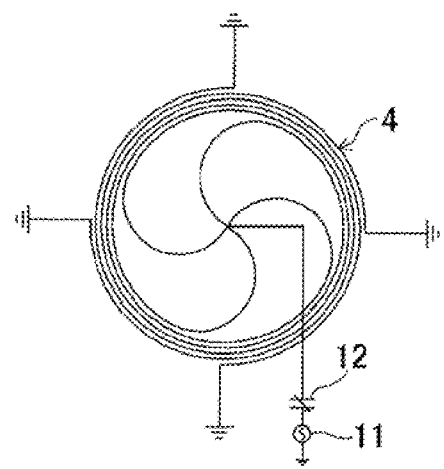
FIG. 4C is a schematic view showing the coil according to the first modification of the first embodiment.

In a modification shown in FIGS. 4A and 4B, a recess portion 5c1 which is shorter chiefly on the inner circumferential side, and a recess portion 5c2 which is longer on the inner circumferential side extending in directions generally orthogonal to longitudinal directions of the coil 4, are provided in multiplicity alternately in the circumferential direction, where the radial length of the recess portions 5c1 toward the inner circumferential side is set shorter than the radial length of the recess portions 5c2. Thus, the closeness of the inner-circumferential side annular areas in the circumferential direction is reduced, so that degradation of the pressure strength of the high-withstand-pressure dielectric member 5 can be suppressed while the applied power efficiency is increased by reducing the dielectric loss of the radio frequency induction magnetic field or inductive coupling power from the coil 4 so that the applied power efficiency is increased. Also, in the example shown in FIGS. 4A and 4B, as in the first embodiment, the coil 4 whose number of turns is increased at high density at outer circumferential ends corresponding to the peripheral-portion side annular area of the high-withstand-pressure dielectric member 5 is combined so as to correspond to both recess portions 5c1, 5c2 of the high-withstand-pressure dielectric member 5.

In the modification of FIGS. 4A and 4B, in particular, the recess portions 5c is so formed that portions of the coil 4 corresponding to the recess portions 5c of the high-withstand-pressure dielectric member 5 are fitted into the recess portions 5c by making use of its location in the coil 4 side upper surface of the high-withstand-pressure dielectric member 5 that seals the upper opening of the chamber so as to allow the coil 4 to enter into grooves of the recess portions, by which the distance to the reactant gas 10 in the chamber 1, which is an object of inductive coupling, is further shortened, so that the applied power efficiency is enhanced. Like this, the recess portions 5c that reduce the transmission loss of the radio frequency induction magnetic field or inductive coupling power from the coil 4 via the high-withstand-pressure dielectric member 5 into the chamber 1 are provided in the coil 4 side upper surface of the high-withstand-pressure dielectric member 5. As a result of this, the reception inductive coupling distance into the recess portions 5c for receiving the corresponding coil system 4a and/or 4b can be lessened by utilizing the recess portions 5c, so that the inductive coupling power acting on the reactant gas 10 in the chamber 1 can be enhanced, thus making it possible to an extent of the above reduction so that the applied power efficiency can be enhanced. In addition, the coil 4 in this example, it is preferable that a linear electrode like a round wire having circular cross section, which is an easy-to-deform wire rod, is used in view of formation of downward-oriented midway bent portions of use fitting into the recess portions 5c.

Figure 5A:
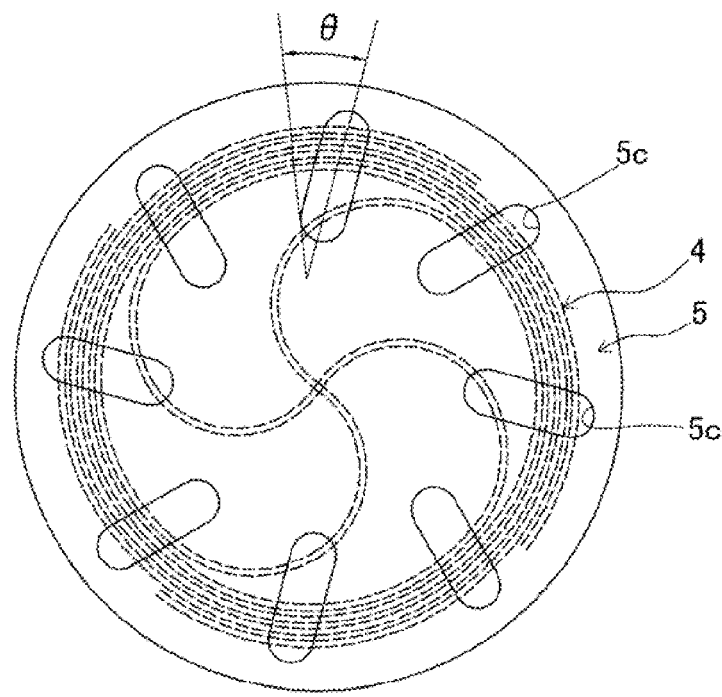
FIG. 5A is a schematic plan view showing a coil and a high-withstand-pressure dielectric member according to a second modification of the first embodiment.
Figure 5B:
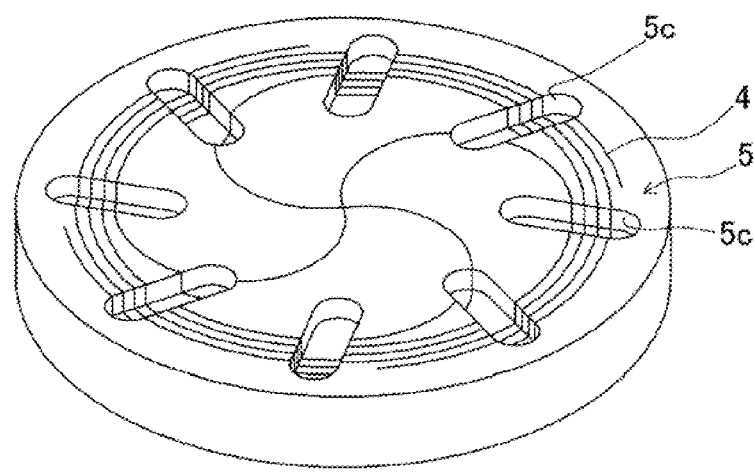
FIG. 5B is a schematic perspective view showing the coil and the high-withstand-pressure dielectric member according to the second modification of the first embodiment.

In the modification shown in FIGS. 5A and 5B, in particular, the recess portions 5c of the high-withstand-pressure dielectric member 5 are skewed within ±15° with respect to a direction of orthogonality to coil lines of high coil turn densities of the coil 4 to satisfy a substantial orthogonality condition, so that while the directivity advantageous for the reduction of transmission loss of the radio frequency induction electromagnetic field or inductive coupling power from the coil 4 is utilized, closeness or the degree of denseness between the recess portions 5c in the circumferential direction can be reduced so that degradation of the pressure strength of the high-withstand-pressure dielectric member 5 can be suppressed. The skew of the recess portions 5c with respect to an orthogonal line to a coil line of the recess portions 5c is shown by reference sign θ. Portions of the coil 4 corresponding to the recess portions 5c of the high-withstand-pressure dielectric member 5 are fitted into the recess portions 5c so that the coil 4 enters into the grooves of the recess portions as in the example of FIGS. 4A and 4B.

Figure 6A:
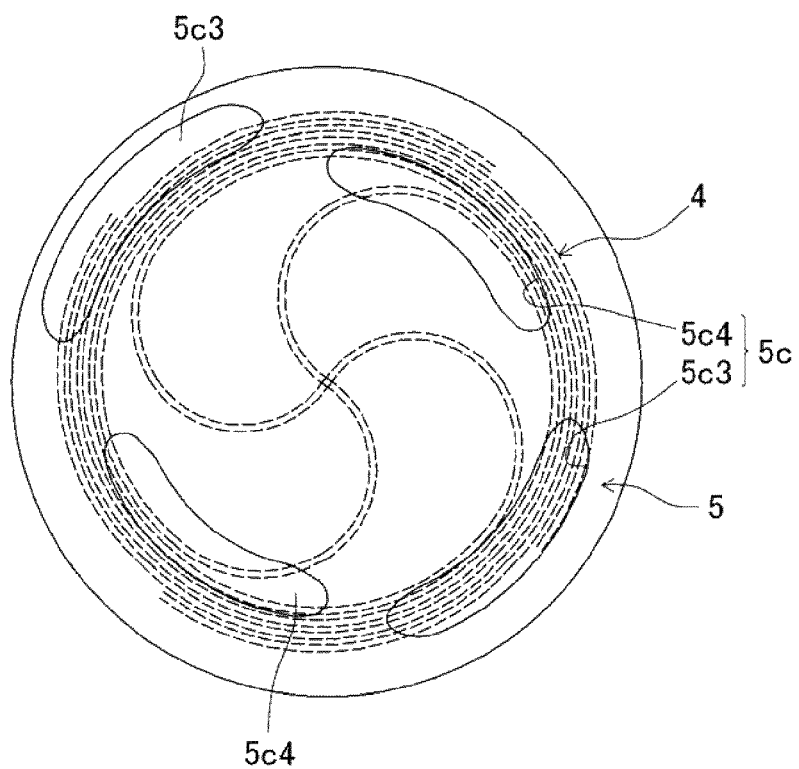
FIG. 6A is a schematic plan view showing a coil and a high-withstand-pressure dielectric member according to a third modification of the first embodiment.
Figure 6B:
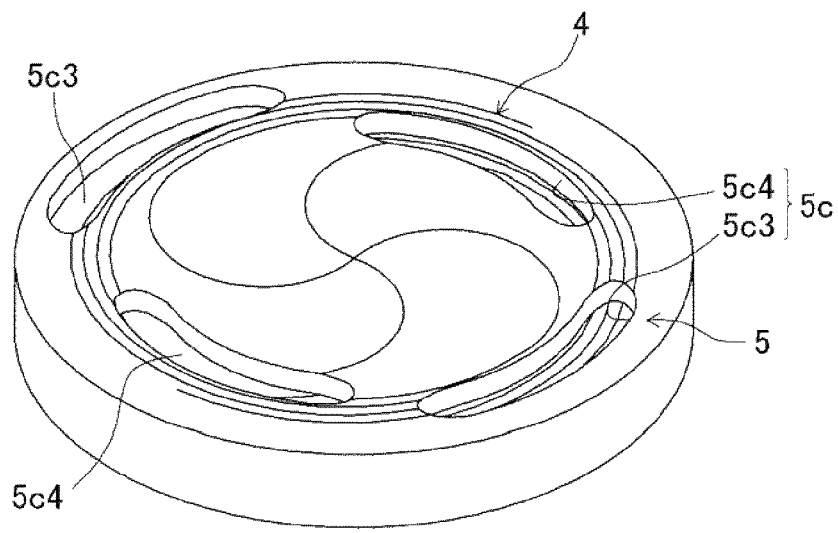
FIG. 6B is a schematic perspective view showing the coil and the high-withstand-pressure dielectric member according to the third modification of the first embodiment.

In a modification shown in FIGS. 6A and 6B, in particular, in a construction that the recess portions 5c are formed longer in the circumferential direction, dielectric loss of the inductive coupling power in the circumferential direction of the coil 4 can be reduced continuously for longer time, hence advantageous for increasing the applied power efficiency, and to a corresponding extent, placement intervals of recess portions 5c adjoining on an identical radius in the circumferential direction are large spaced from each other, thus making it possible to reduce adverse effects of the circumferentially longer recess portions 5c on the pressure strength of the high-withstand-pressure dielectric member 5. Also, by providing a staggered array that an outer circumferential recess portion 5c3 and an inner circumferential recess portion 5c4 with respect to the outer circumferential end side area which is higher in coil turn density of the coil 4 are placed alternately in the circumferential direction, by which closeness of circumferentially longer recess portions 5c on an identical radius is relaxed. Thus, adverse effects of the circumferential-oriented recess portions 5c on degradation of the pressure strength of the high-withstand-pressure dielectric member 5 is suppressed. Portions of the coil 4 corresponding to the recess portions 5c of the high-withstand-pressure dielectric member 5 are fitted into the recess portions 5c so that the coil 4 enters into the grooves of the recess portions as in the example of FIGS. 4A and 4B.

Figure 7:
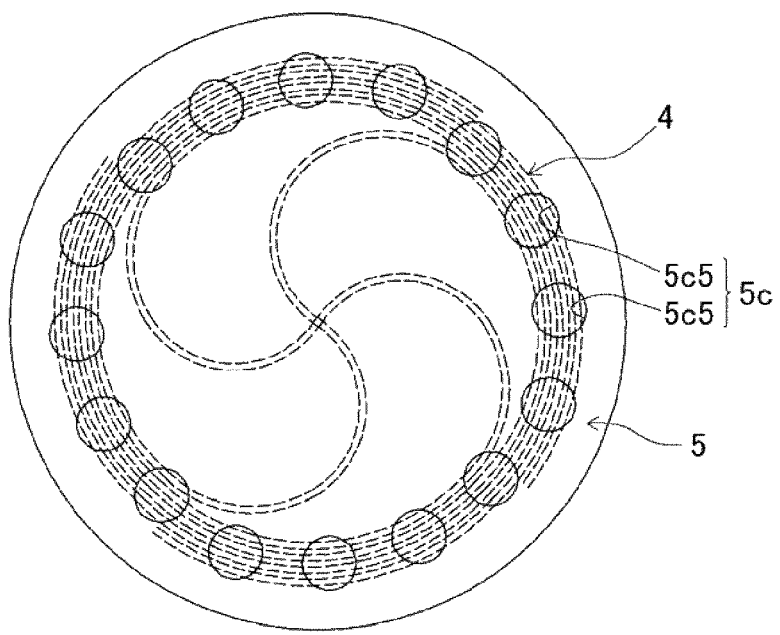
FIG. 7 is a schematic plan view showing a coil and a high-withstand-pressure dielectric member according to a fourth modification of the first embodiment.
Figure 8:
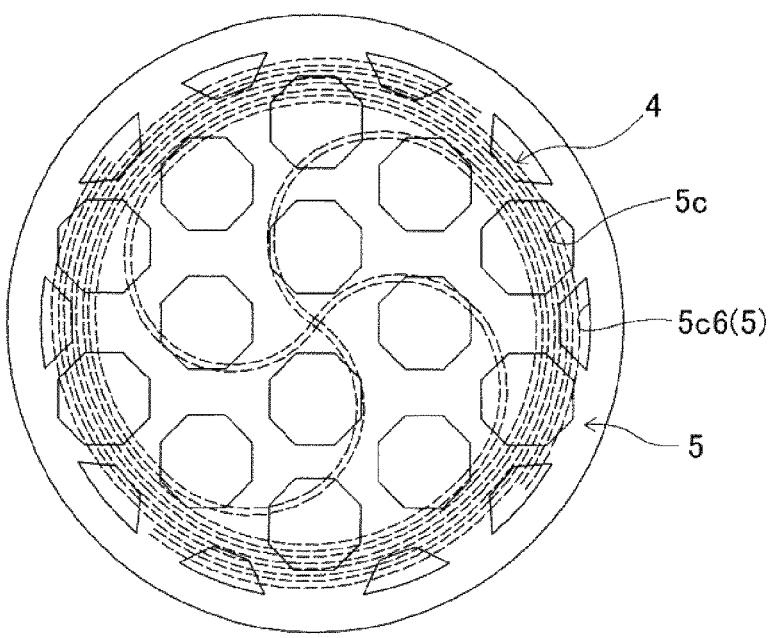
FIG. 8 is a schematic plan view showing a coil and a high-withstand-pressure dielectric member according to a fifth modification of the first embodiment.

In the example shown in FIG. 7, in particular, instead of the circumferential recess portions 5c3, 5c4 shown in FIGS. 5A and 5B, recess portions 5c5 having a circumferentially shorter shape such as a circular shape are arrayed at equal intervals in the circumferential direction with respect to circumferentially longer recess portions 5c3, 5c4, by which continuity over the circumferential whole areas of the recess portions 5c is relaxed to suppress influences on degradation of the pressure strength of the high-withstand-pressure dielectric member 5. Although the recess portions 5c are arrayed circumferentially at equal intervals also in this case, yet the recess portions 5c5 may be staggered including those closer to the outer circumferential side and those closer to the inner circumferential side.

The recess portions 5c are so formed as to be smaller in volume and lighter in weight within such a range as not impair the pressure strength of the high-withstand-pressure dielectric member 5, thus making it easier to handle in assembly, maintenance and the like. In terms of such aspects, the larger total placement area is increasingly preferable. Therefore, in the example shown in FIG. 8, while the high-density placement corresponding to a higher-density distribution on the outer circumferential end side of the peripheral-portion side annular area of the coil 4 is applied also in this case, yet the recess portions 5c are staggered independently of the distribution of radio frequency induction magnetic field or inductive coupling power or low-distortion distribution areas of the coil 4 or arranged in another way so that the high-withstand-pressure dielectric member 5 is formed into a honeycomb-structure mode. Thus, the utmost reduction of weight can be achieved while sufficient measures for the pressure strength and the reduction of transmission loss of the radio frequency induction magnetic field or inductive coupling power from the coil 4 as well as the resultant improvement of applied power efficiency are taken and contrived. In the example shown in FIG. 8, the recess portions 5c are regular octagonal-shaped so that the high-withstand-pressure dielectric member 5 is formed into the above-described honeycomb structure by the staggered recess portions 5c. However, this is not limitative, and the recess portions 5c may freely be formed into hexagonal, elliptical, circular or other shapes, where inner corners of the recess portions are preferably round shaped for avoidance of stress concentration. Also in the example shown in FIG. 8, even in regions of the outermost peripheral portion where the regular octagonal recess portions 5c cannot be placed whereas the coil 4 is placed, recess portions 5c6 each formed into a partial shape of the regular octagon are placed so as to enhance the placement density of the recess portions 5c corresponding to the coil distribution density, i.e. turn density, of the coil 4 in the peripheral-side annular area of the high-withstand-pressure dielectric member 5, thus making it advantageously achievable to reduce transmission loss of the radio frequency induction magnetic field or inductive coupling power from the coil 4 via the high-withstand-pressure dielectric member 5 into the chamber 1.

Figure 9:
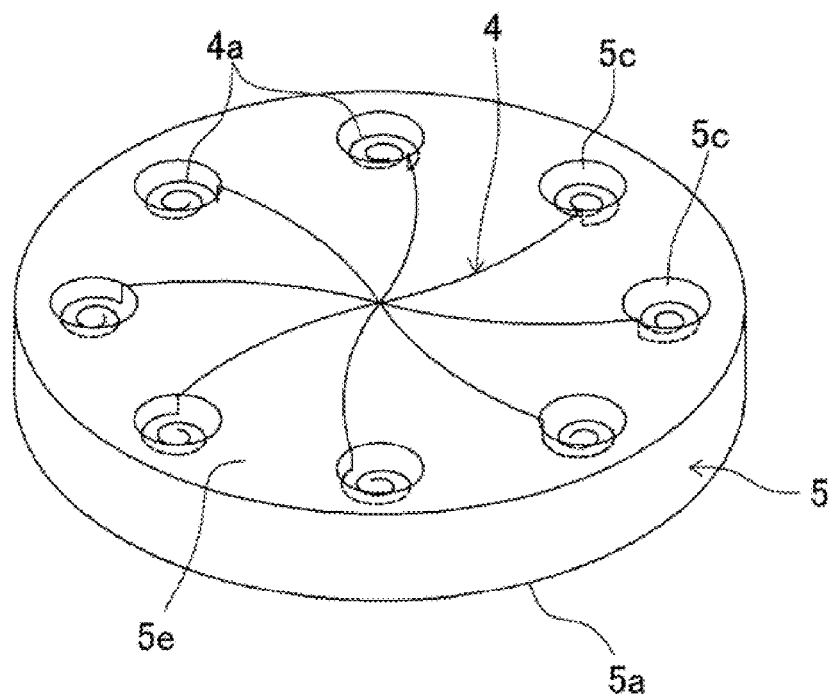
FIG. 9 is a schematic perspective view showing the coil and the high-withstand-pressure dielectric member according to the fifth modification of the first embodiment.

In the example shown in FIG. 9, spirally turned forward portion of the coil 4 is fitted into the circular recess portions 5c, by which the coil 4 enters into the groove portions of the recess portions 5c. By this placement, the distance to the reactant gas 10 in the chamber 1, which is the inductive coupling object, is further shortened so that the applied power efficiency is enhanced.

Second Embodiment

Figure 10A:
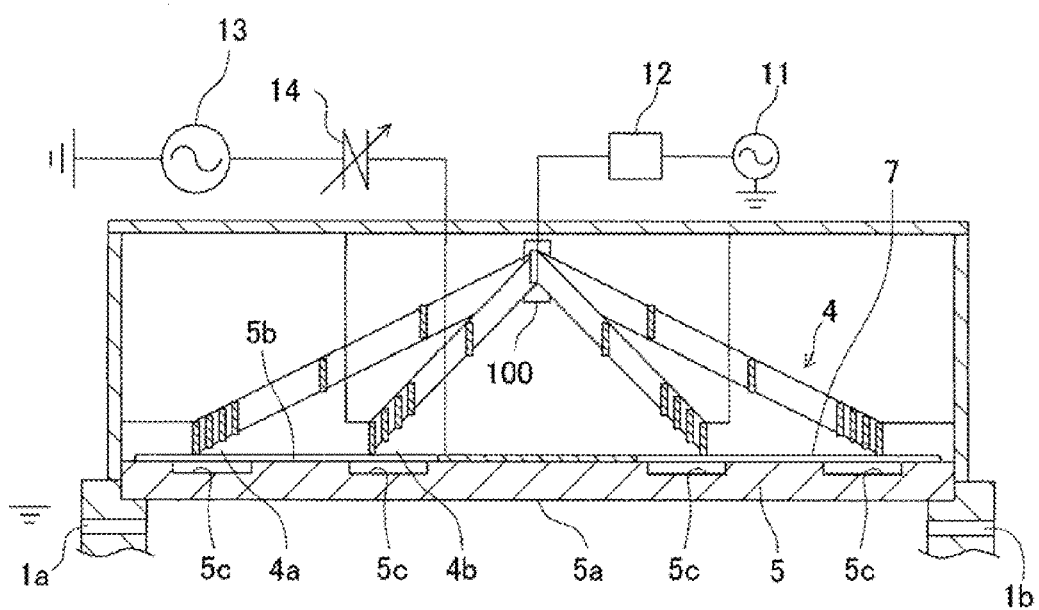
FIG. 10A is a partial schematic sectional view showing a plasma etching apparatus according to a second embodiment of the present invention.
Figure 10B:
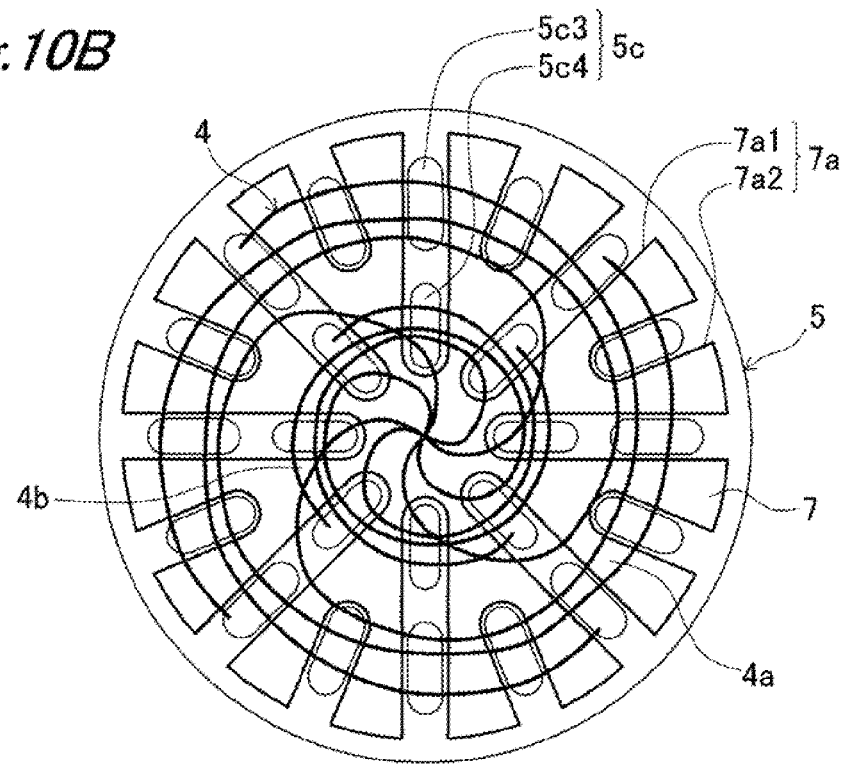
FIG. 10B is a schematic plan view showing a coil, a high-withstand-pressure dielectric member and an electrode.

FIGS. 10A and 10B show a plasma etching apparatus according to a second embodiment of the invention.

Semiconductor wafers, which are objects treated by plasma processing, have been increasing in diameter more and more, as large as 200 mm to 300 mm at the present time, while the chambers for treating wafers have been further increasing in inner diameter, as large as 320 mm to 450 mm. Still more, etching has been attaining higher precision while the etching depth has also been increasing. In order to meet these requirements, there is a need for generating plasma more uniformly and more vigorously over a wide area. For this purpose, it is effective to exert a high level of radio frequency induction magnetic field or inductive coupling power from the higher-density distribution area of the coil of the peripheral-portion side annular area on the peripheral portion side of the high-withstand-pressure dielectric member in correspondence to the supply of the reactant gas into the coil chamber. However, large-diameter coils corresponding to wide plasma generation areas would result in weak plasma generation on the central portion side. Therefore, in order to improve the uniformity of plasma densities, the chamber-heightwise interval between an upper electrode (coil) 4 (for inductive coupling) that is an electrodes located above the high-withstand-pressure dielectric member 5 as well as the high-withstand-pressure dielectric member 5, and the placement section 3 that holds the object 2 is widened to thereby maintain the uniformity by diffusion of the plasma generated on the peripheral portion side in the chamber toward the central portion side. However, in this case, the chamber capacity would become large, necessarily incurring degradation of the plasma density, with the result that neither generating a large-area, highly uniform plasma nor generating a high degree of plasma could not be satisfied.

In this embodiment, conversely, the plasma 6 is uniformized by the arrangement that high-density placement sections with an increased number of turns of the coil 4 are set not only in the peripheral-portion side annular area of the chamber 1 but also in one or more central-portion side annular areas on the central portion side inward of the peripheral-portion side annular area.

More specifically, in this embodiment, the coil 4 is composed of a coil system 4a in which the number of turns is increased in the annular area 5d1 (see FIG. 2A) in the peripheral portion of the high-withstand-pressure dielectric member 5 so as to provide an enhanced distribution density, and a coil system 4b in which the number of turns is increased in the annular area 5d2 on the inner circumferential side more than the annular area 5d2 (see FIG. 2A) of the high-withstand-pressure dielectric member 5 so as to provide an enhanced distribution density. Both coils 4a, 4b have their number of turns increased so as to provide higher density on their respective outer circumferential end side in an identical plan view. Thus, the coil 4 has distribution densities enhanced in vicinities of the outer peripheral edge of the high-withstand-pressure dielectric member 5 and in an intermediate area between the center and the outer peripheral edge of the high-withstand-pressure dielectric member 5. The coils 4a, 4b are branched from a substantially common height position of the support shaft 100 so that radio frequency power is supplied from a common power source 11.

Both coil systems 4a, 4b are spirally expanded diagonally downward from the central portion, which is located on the upper surface side of the high-withstand-pressure dielectric member 5 that seals the upper opening of the chamber 1, toward the peripheral portion so that the higher-density distribution area is formed lower in the heightwise direction than the lower-density distribution area so as to be closer to the upper surface of the high-withstand-pressure dielectric member that seals the upper opening of the chamber than the lower-density distribution area as already described. In other words, both coil systems 4a, 4b have their coils three-dimensionally made up so that the higher-density distribution area on the peripheral portion side is closer to the plasma generation area with the result that an application point of radio frequency power on the central portion side of the coil 4 is away from the high-withstand-pressure dielectric member.

With such a turn mode in which the number of turns is increased in the two annular areas, peripheral portion side and central portion side, so that the distribution density of the coil 4 is enhanced, plasma generation over a wider area is fulfilled by the concentrated inductive coupling action from a local position rather closer to the outer peripheral edge side in the peripheral-portion side annular area where the coil 4 is of high density, whereas in a case where there may be insufficiency of plasma generation on the inner side of the peripheral-portion side annular area due to increases of the plasma generation area in the peripheral-portion side annular area, the coil 4 is enabled to exert, also in this case, the concentrated advantageous action derived from local portions of high densities similar to those of the peripheral-portion side annular area by virtue of the inclusion of one or more central-portion side annular areas in addition to the peripheral-portion side annular area, allowing the deficiency to be compensated, hence preferable for treatment of larger-diameter wafer.

As shown in FIG. 10B, the recess portions 5c formed in the upper surface 5a of the high-withstand-pressure dielectric member 5 in this embodiment include recess portions 5c3 extending in radial directions of the high-withstand-pressure dielectric member 5 in the annular area 5d1 (see FIG. 2A), and recess portions 5c4 extending in radial directions of the high-withstand-pressure dielectric member 5 in the inner-circumferential side annular area 5d2 than the annular area 5d2 (see FIG. 2A) of the high-withstand-pressure dielectric member 5. The recess portions 5c3 are formed in correspondence to portions of higher distribution densities in the outer peripheral portion of the coil system 4a, while the recess portions 5c4 are formed in correspondence to portions of higher distribution densities in the outer peripheral portion of the coil system 4b. As viewed along the circumferential direction of the high-withstand-pressure dielectric member 5, the recess portions 5c4 are placed every other recess portion 5c3 in line with each other in radial directions of the high-withstand-pressure dielectric member 5.

As shown in FIG. 10B, two types of radio frequency transmission portions 7a1, 7a2 are formed in the electrode 7 in this embodiment. On one hand, radio frequency transmission portions 7a1 are provided in correspondence to the in-line recess portions 5c3, 5c4 and are slits or cutouts extending from the outer peripheral edge to near the center of the electrode 7 through over its thicknesswise direction. On the other hand, radio frequency transmission portions 7a2 are provided in correspondence to the recess portions 5c3 not aligned with the recess portions 5c4 and are slits or cutouts which extend from outer peripheral edge to near center of the electrode 7 through in its thicknesswise direction, and which are shorter than the radio frequency transmission portions 7a1. In other words, the radio frequency transmission portions 7a1 are formed so as to stretch both annular areas 5d1, 5d2 (see FIG. 2A) of the high-withstand-pressure dielectric member 5, while the radio frequency transmission portions 7a2 are formed only in the peripheral annular area 5d1 (see FIG. 2A) on the outer side of the high-withstand-pressure dielectric member 5.

Figure 10C:
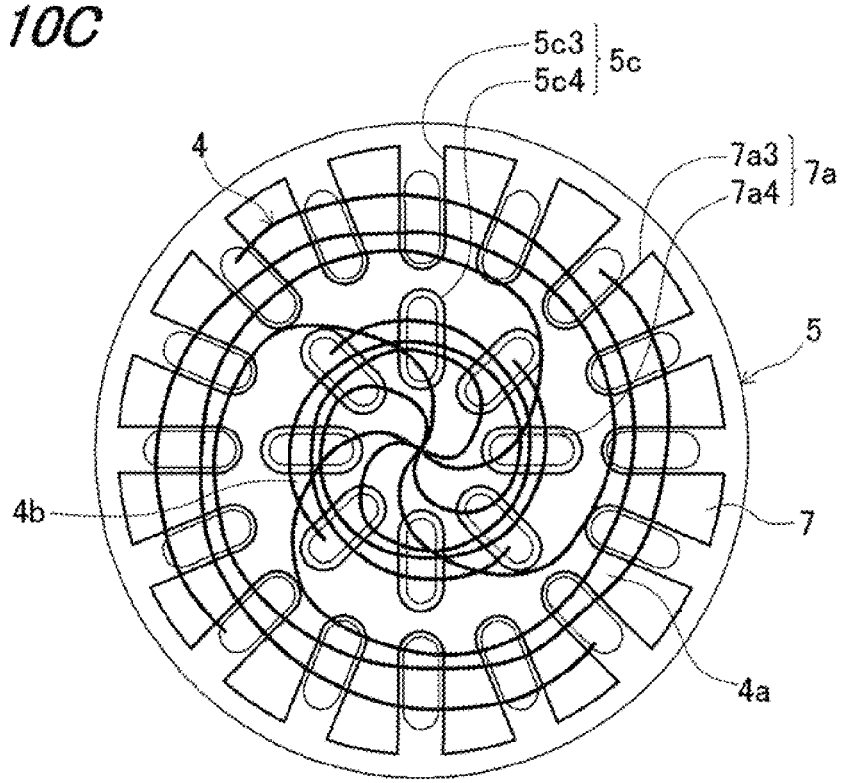
FIG. 10C is a schematic plan view showing a coil, a high-withstand-pressure dielectric member and an electrode of a first alternative.
Figure 10D:
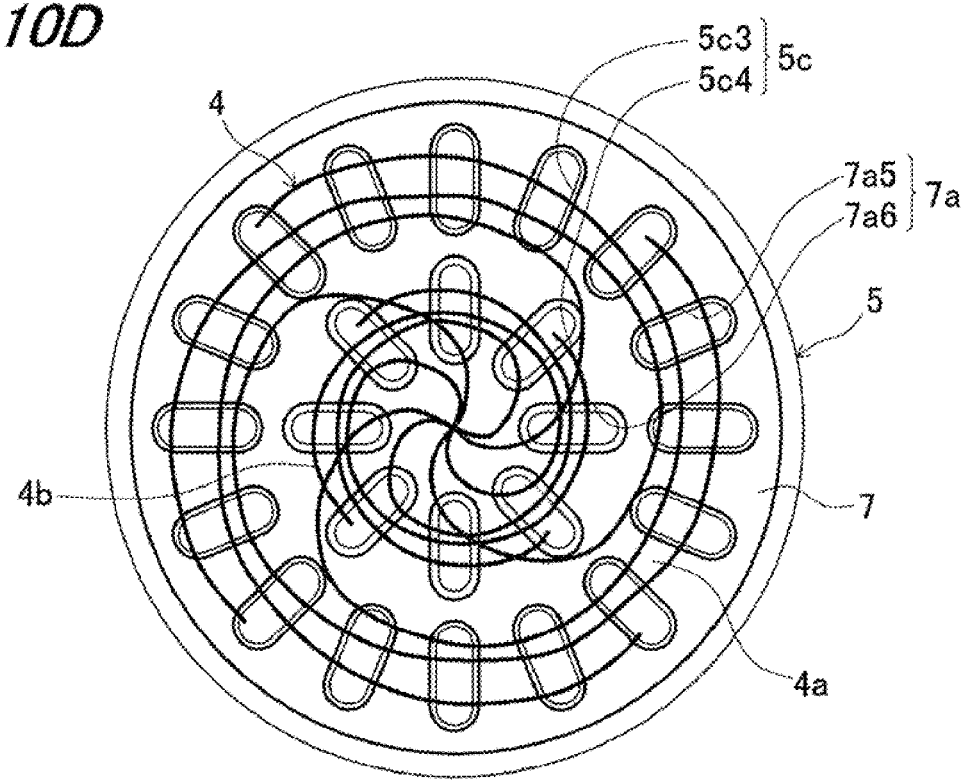
FIG. 10D is a schematic plan view showing a coil, a high-withstand-pressure dielectric member and an electrode of a second alternative.

As shown in FIG. 10C, it is also allowable to provide, in the electrode 7, radio frequency transmission portions 7a3 which are slits or cutouts extending from the outer peripheral edge of the electrode 7 in correspondence to the outer recess portions 5c3, and radio frequency transmission portions 7a4 which are window portions formed intermediately (peripheral annular area 5d1 of the high-withstand-pressure dielectric member 5) between the outer periphery and the center of the electrode 7 in correspondence to the inner recess portions 5c4. Instead, as shown in FIG. 10D, radio frequency transmission portions 7a5, 7a6, which are window portions, may be provided in the electrode 7 in correspondence to the outer and inner recess portions 5c3, 5c4, respectively.

Figure 11A:
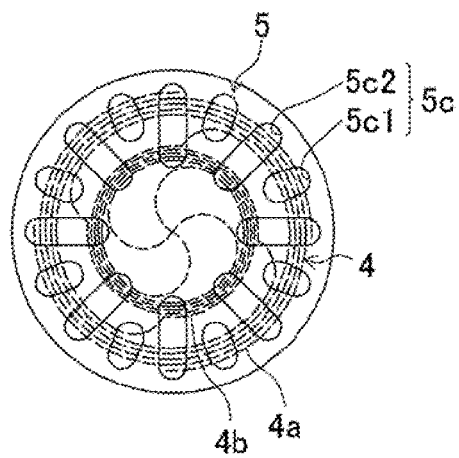
FIG. 11A is a schematic plan view showing a coil and a high-withstand-pressure dielectric member according to a modification of the second embodiment.
Figure 11B:
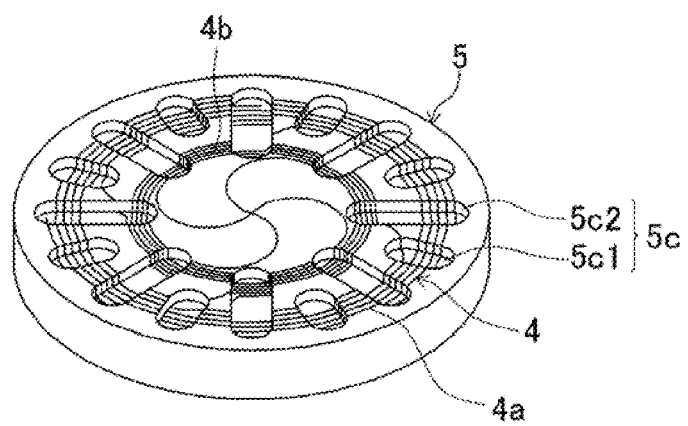
FIG. 11B is a schematic plan view showing a coil and a high-withstand-pressure dielectric member according to a modification of the second embodiment.
Figure 11C:
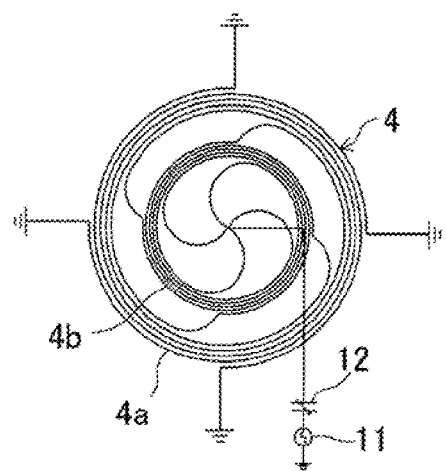
FIG. 11C is a schematic view showing the coil in the modification of the second embodiment.

FIGS. 11A to 11C show a modification of the second embodiment.

In this example, as in the second embodiment, a coil system 4a in which the number of turns is increased in the peripheral-portion side annular area, and a coil system 4b in which the number of turns is increased in the central-portion side annular area, are formed by the coil 4 which is formed by one coil material turned and expanded from the center, where the coil system 4a is set correspondent with the recess portions 5c1, 5c2 (see FIGS. 2A and 2B) formed in the high-withstand-pressure dielectric member 5 in the same configuration and placement as in the first embodiment. The coil system 4b in the central-portion side annular area is combined so as to correspond to the recess portions 5c2, where the setting of the recess portions 5c2 being longer than the recess portions 5c1 toward the central side is utilized for correspondence of the coil system 4b to the recess portions 5c2 so that electric field transmission from the coil system 4b is enhanced. As a result, radio frequency induction magnetic field or inductive coupling power exerted on the reactant gas in the central-portion side annular area is enhanced, by which uniformization of plasma generation can be achieved so as to be suitable for larger-diameter wafers while plasma generation over wider areas is managed.

As shown above, in the case where the coil 4 includes one or more high-density central-portion side annular areas provided on the inner circumferential side of the high-density annular area of the peripheral-side coil, concentrated placement of the recess portions 5c correspondingly also in the single or plurality of high-density central-portion side annular areas makes it possible to transmit radio frequency induction magnetic field or inductive coupling power from those single or plurality of high-density central-portion side annular areas into the chamber 1 with their loss lessened.

Third Embodiment

Figure 12:
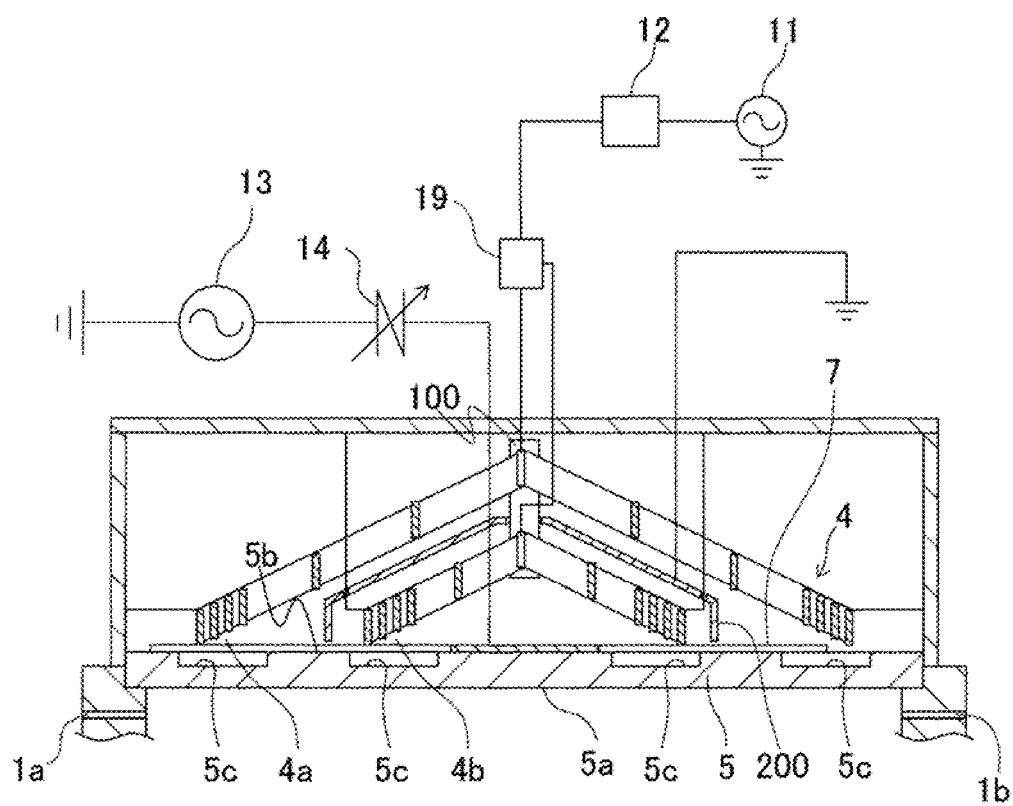
FIG. 12 is a partial schematic view showing a plasma etching apparatus according to a third embodiment of the invention.

FIG. 12 shows a plasma etching apparatus according to a third embodiment of the invention.

In this embodiment, a coil system 4a in which the number of turns is increased in the peripheral-portion side annular area, and a coil system 4b in which the number of turns is increased in the central-portion side annular area, are placed so as to be turned and expanded from different heights in upper and lower two stages, independently of each other, through a common central support shaft 100, where both coil systems 4a, 4b have their number of turns increased in one identical plane. Also, with a splitter 19 provided, radio frequency powers are supplied to the individual coil systems 4a, 4b, independently of each other, from a common power source 11. As a result of this, supply amount of the radio frequency power can be controlled for each of the coil systems 4a, 4b, i.e., for individual radial areas of the high-withstand-pressure dielectric member 5, so that plasma generated in the chamber 1 can be uniformized. The coils 4a, 4b are formed by turning independent plate electrodes, individually, but supported by the central support shaft 100 containing at least an insulating material. In this point of view, the support structure for the coils 4a, 4b is simple.

Without using the splitter 19, radio frequency powers may be supplied to the individual coil systems 4a, 4b from two independent power sources, respectively. It is also allowable to supply one radio frequency power of equality from a common power source to the coil systems 4a, 4b. In this case, the common central support shaft 100, made from a conductive material, applies one radio frequency power of equality.

A shield 200 which is a grounded metallic hood or enclosure is placed between the outer coil system 4a and the inner coil system 4b. With this shield 200 provided, interference between an electromagnetic field generated by the coil system 4a and an electromagnetic field generated by the coil system 4b can be prevented, so that generation efficiency of radio frequency induction electromagnetic fields or inductive coupling powers generated by the individual coil systems 4a, 4b, respectively, against radio frequency power supplied from the power source can be improved.

Figure 13:
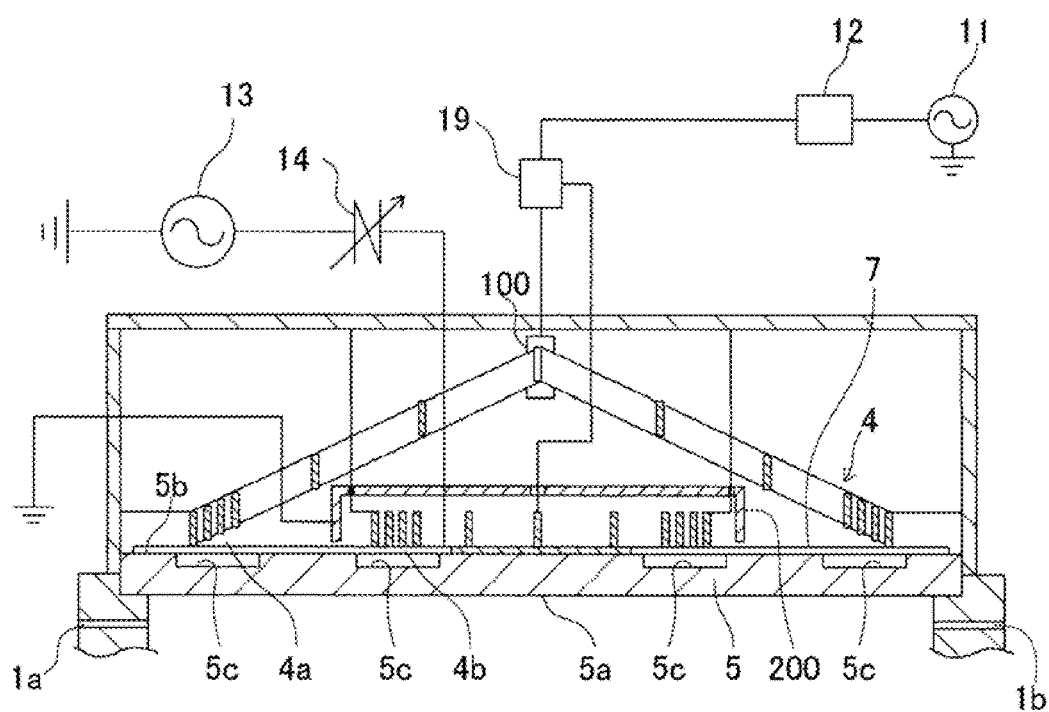
FIG. 13 is a partial schematic view showing a plasma etching apparatus according to a modification of the third embodiment of the invention.

FIG. 13 shows a modification of the third embodiment. This example of FIG. 13 differs from the third embodiment in that the inner coil system 4a is not three-dimensional but planar structured.

Various modifications of the invention will be described below with reference to FIGS. 14A to 17C.

Figure 14A:
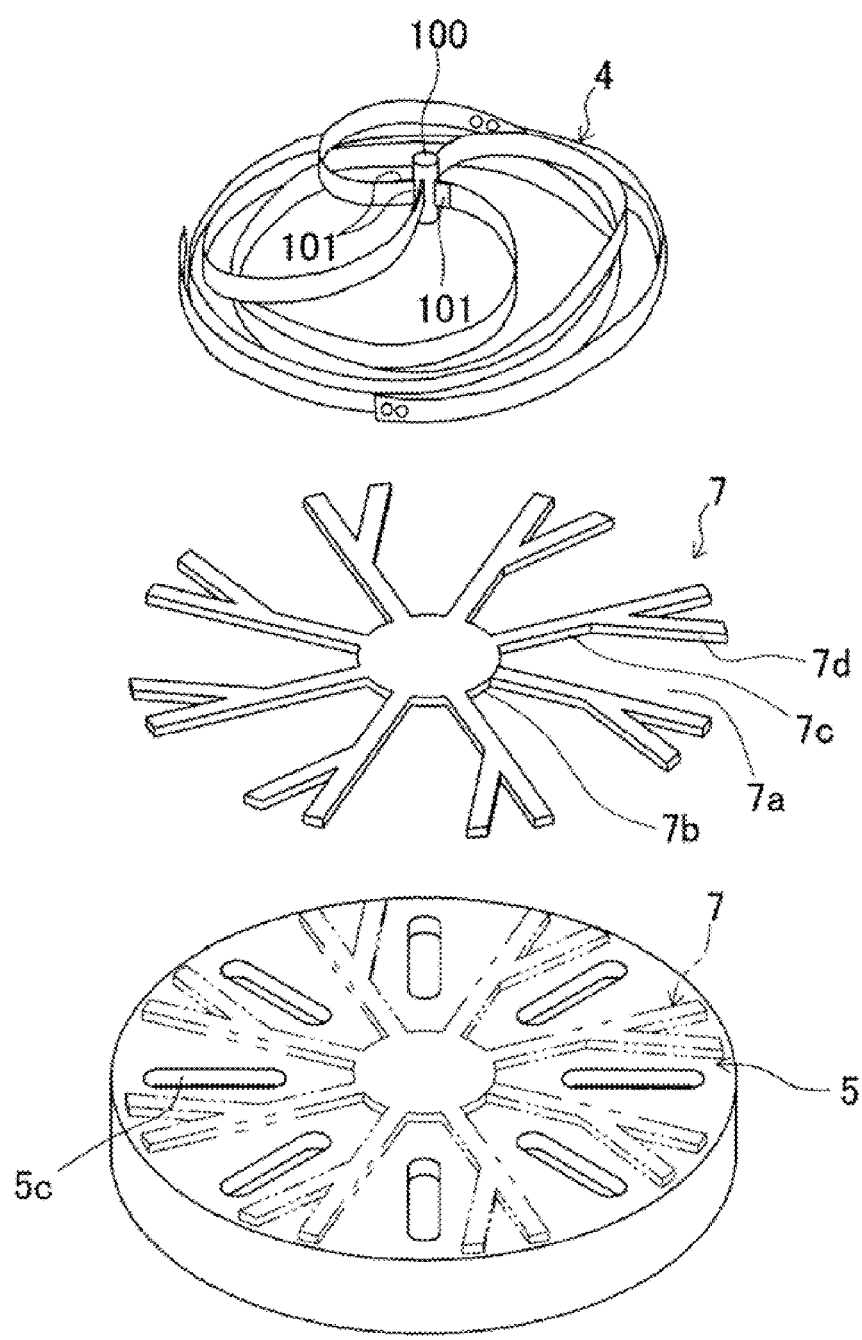
FIG. 14A is a schematic exploded perspective view showing a coil, an electrode and a high-withstand-pressure dielectric member in a first modification of the invention.
Figure 14B:
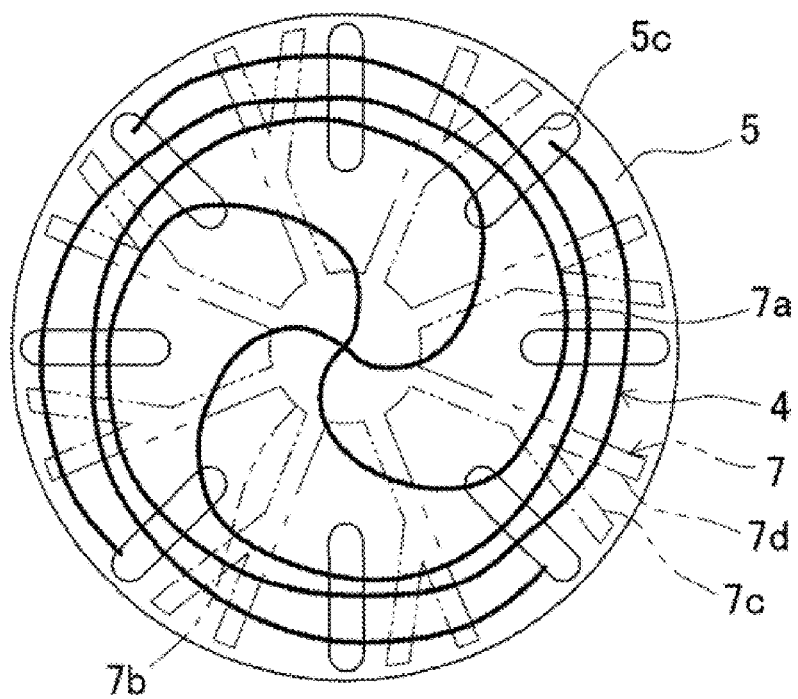
FIG. 14B is a schematic plan view showing a coil, an electrode and a high-withstand-pressure dielectric member in the first modification of the invention.

FIGS. 14A and 14B show a modification of the electrode 7. This electrode 7 includes a plurality of main branch-like portions 7c extending radially from the central portion 7b in radial directions. From between a base end and a forward end of each main branch-like portion 7c is branched a sub branch-like portion 7d enough shorter than the main branch-like portion 7c. An opening between mutually radially neighboring main branch-like portions 7c functions as a radio frequency transmission portion 7a. Individual radio frequency transmission portions 7a are provided in correspondence to the recess portions 5c of the high-withstand-pressure dielectric member 5.

Figure 15:
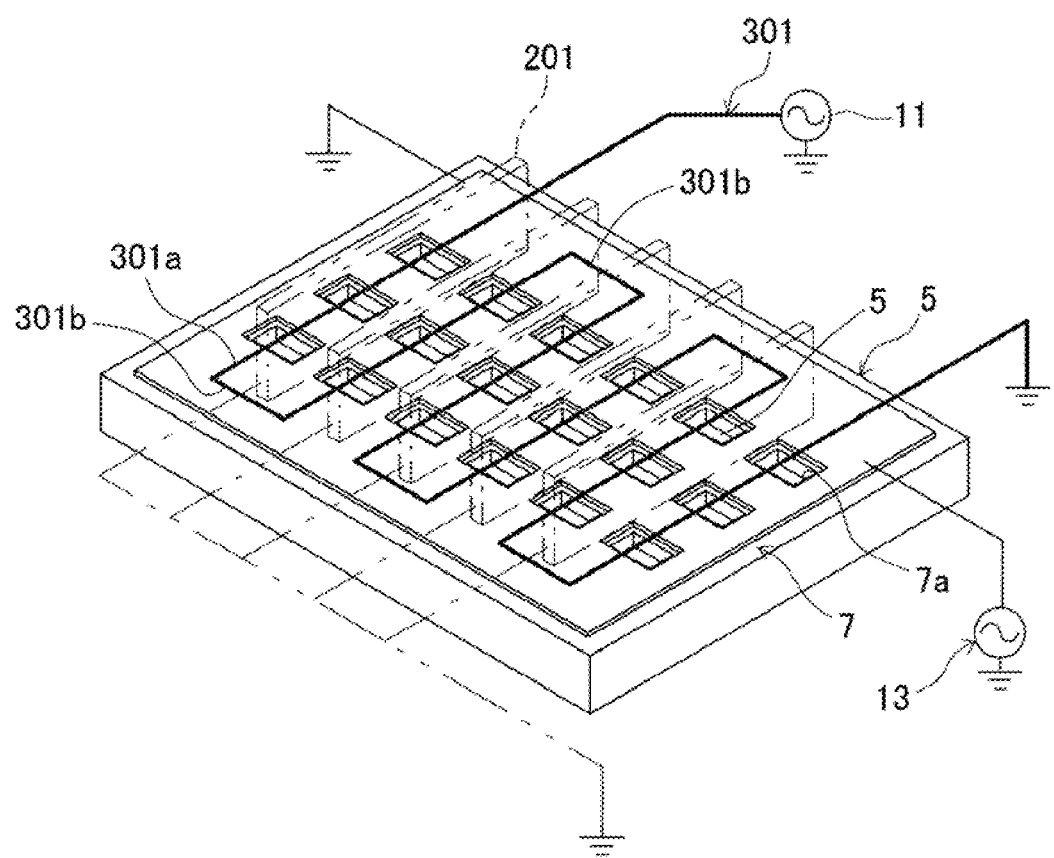
FIG. 15 is a partial schematic perspective view showing a plasma etching apparatus according to a second modification of the invention.

In a modification example shown in FIG. 15, an electrode 301 for inductive coupling is formed of one conductor which is not coil-shaped but zigzag bent on one plane. More specifically, the electrode 301 includes a plurality of longer portions 301a placed parallel to one another with a distance provided therebetween on the same plane, and shorter portions 301b which connect neighboring longer portions 301a to each other. The high-withstand-pressure dielectric member 5 is not circular-plate but rectangular-plate shaped, and rectangular-shaped recess portions 5c in plan view are formed in its upper surface at positions corresponding to the longer portions 301a of the electrode 301. The electrode 7, which is an FS electrode, is also rectangular-plate shaped, and radio frequency transmission portions 7a, which are rectangular-shaped window portions in plan view, are formed at positions corresponding to the recess portions 5c of the high-withstand-pressure dielectric member 5 through the thicknesswise direction. Further, a shield 201, which is a grounded metallic flat plate, is placed between neighboring longer portions 301a. An electromagnetic field is generated on a plane orthogonal to the direction in which each longer portion 301a. Interference between electromagnetic fields generated by neighboring longer portions 301a is prevented by is prevented by the plate-shaped shield 201. The shield 201 may be provided in a form of hood or enclosure covering all the 301a of 301 portions and 301b of 301 portions.

Figure 16:
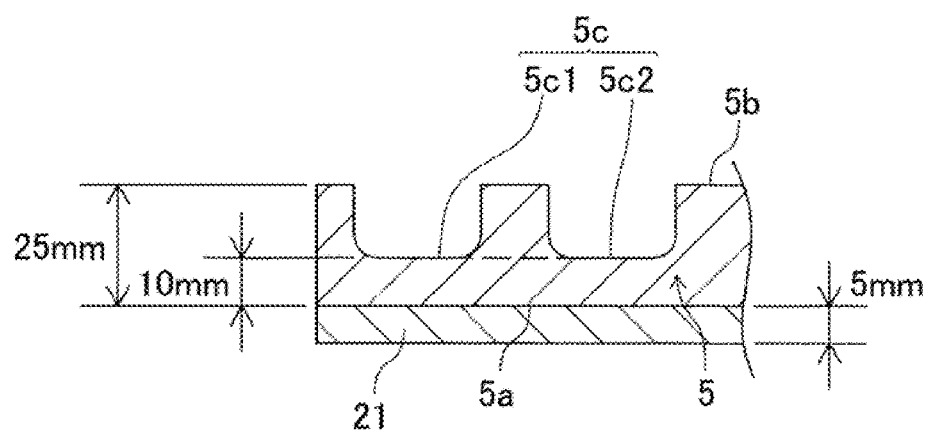
FIG. 16 is a partial schematic sectional view showing a high-withstand-pressure dielectric member and a cover in a third modification of the invention.

As shown in FIG. 16, with a separate cover 21 provided under the high-withstand-pressure dielectric member 5, wear and tear of the high-withstand-pressure dielectric member 5 can be prevented. As the material of the cover 21, for example, quartz, SiN, SiC or the like is used when Cl base gas is used as the reactant gas, and AlN, $Al_2O_3$, $Y_2O_3$ or the like is used when F (fluorine) base gas is used as the reactant gas, by which wear and tear of the cover 21 can be reduced.

Figure 17A:
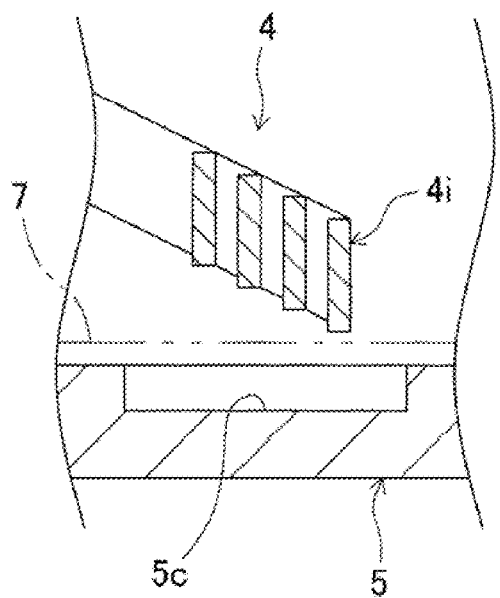
FIG. 17A is a schematic partial sectional view showing depth setting of the recess portion in the first to third embodiments.
Figure 17B:
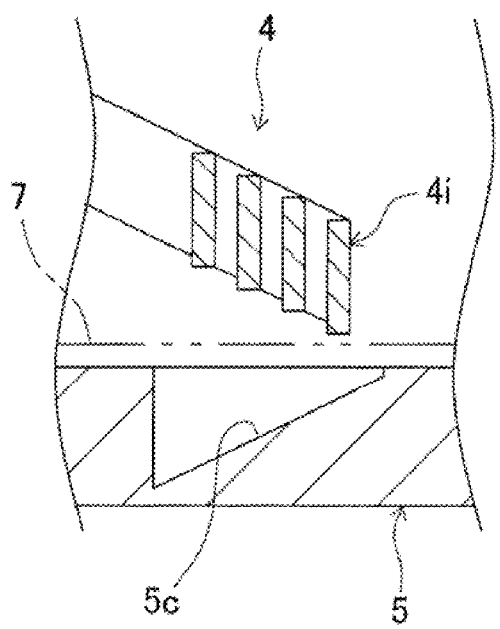
FIG. 17B is a schematic partial sectional view showing depth setting of the recess portion in the fourth modification.

As shown in FIG. 17A, in the first to third embodiments, the recess portions 5c provided in the high-withstand-pressure dielectric member 5 are constant in depth, and the high-withstand-pressure dielectric member 5 is constant in thickness at the portions of the recess portions 5c (first thickness). However, the thickness of the high-withstand-pressure dielectric member 5 at the portions of the recess portions 5c may be set in various ways according to the distribution densities of the coil 4. For example, as shown in FIG. 17B, in a case where portions of narrow intervals between the conductors of the coil 4, i.e. high distribution-density portions 4i, are formed oblique to the flat upper surface of the high-withstand-pressure dielectric member 5, the bottom face of each recess portion 5c may be formed oblique so that the high-withstand-pressure dielectric member 5 have a distribution at the portions of the recess portions 5c. In FIG. 17B, the bottom portion of each recess portion 5c is skewed so that the thickness of the high-withstand-pressure dielectric member 5 decreases more and more with increasing distance from the high distribution-density portions 4i to the high-withstand-pressure dielectric member 5. The more the coil 4 is away from the chamber 1, the more the radio frequency induction magnetic field or inductive coupling power from the coil 4 decreases. However, with the construction of FIG. 17B, the more the coil 4 is away from the chamber 1, the more the thickness of the high-withstand-pressure dielectric member 5 decreases while the transmission efficiency of the radio frequency induction magnetic field or inductive coupling power from the coil 4 increases, so that the decreases of the radio frequency induction magnetic field or inductive coupling power due to increases of the distance from the chamber 1 can be canceled by differences in transmission efficiency. That is, with the construction of FIG. 17B, even if the high distribution-density portions 4i of the coil 4 are formed oblique to the flat upper surface of the high-withstand-pressure dielectric member 5, the radio frequency induction magnetic field or inductive coupling power acting on the chamber 1 from the portions 4i can be uniformized.

Figure 17C:
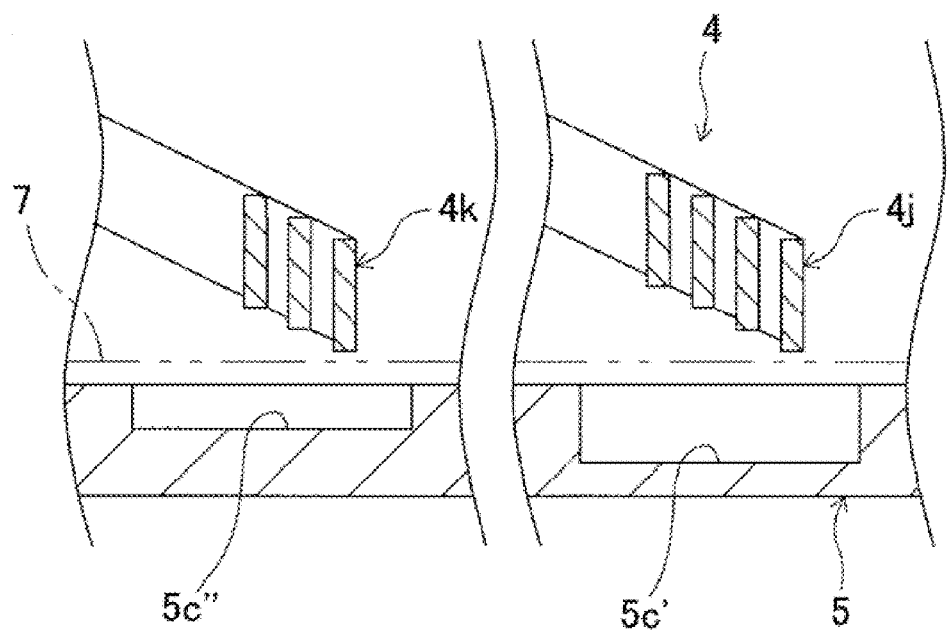
FIG. 17C is a schematic partial sectional view showing depth setting of the recess portion in a fifth modification.

By the dimensions of the recess portions 5c, the radio frequency induction magnetic field or inductive coupling power from the coil 4 can be controlled. For example, as shown in FIG. 17C, the radio frequency induction magnetic field or inductive coupling power from high distribution-density portions 4j outward of the coil 4 can be enhanced relative to the radio frequency induction magnetic field or inductive coupling power from high distribution-density portions 4k inward of the coil 4 by a setting that recess portions 5c' corresponding to the high distribution-density portions 4j are larger in width and larger in depth (smaller in thickness of the high-withstand-pressure dielectric member 5) than recess portions 5c'' corresponding to the high distribution-density portions 4k.

The present invention provides a plasma etching apparatus using an electrode for plasma and an electrode for prevention of reaction product deposition, which can be made excellent in durability and higher in applied-power efficiency with a low-cost chamber-sealed structure using a high-withstand-pressure dielectric member.

The invention claimed is:

1. A plasma etching apparatus comprising:
   a chamber which can be depressurized, said chamber having an upper opening;
   a placement section provided in an interior of said chamber to hold an object to be treated;
   a first electrode placed so as to face said upper opening of said chamber and to which AC power is to be applied to transform a reactant gas within said chamber into a plasma by inductive coupling so that the object held at said placement section is subjected to etching;
   a dielectric member mounted to said chamber so as to seal said upper opening of said chamber, said dielectric member having a plurality of mutually independent recess portions of a first thickness and a large-thickness portion of a second thickness larger than the first thickness, said large-thickness portion being continuous except at said recess portions; and
   a second electrode placed between said first electrode and said dielectric member;
   wherein said recess portions of said dielectric member are located so as to align, in plan view, with portions of said first electrode; and
   wherein said second electrode has, formed therethrough in a thickness direction thereof, plural radio frequency transmission portions, said radio frequency transmission portions respectively extending so as to be substantially orthogonal to said portions of said first electrode, such that respective ones of said portions of said first electrode align, in plan view, with respective ones of said radio frequency transmission portions of said second electrode and with respective ones of said recess portions of said dielectric member.

2. The plasma etching apparatus according to claim 1, wherein
   said first electrode is configured so as to have a section of higher electrode density and a section of lower electrode density that is lower in electrode density than said section of higher electrode density; and
   said recess portions of said dielectric member are arranged so that more area, in plan view, of the recess portions is provided in alignment with said section of higher electrode density than said section of lower electrode density.

3. The plasma etching apparatus according to claim 2, wherein
   said first electrode comprises at least one coil including plural coil turns;
   said section of higher electrode density is constituted by a section of said at least one coil having a higher density of turns; and
   said section of lower electrode density is constituted by a section of said at least one coil having a lower density of turns lower in density than said section having the higher density of turns.

4. The plasma etching apparatus according to claim 3, wherein
   said section of higher electrode density is disposed at a peripheral portion of said first electrode; and
   said section of lower electrode density is disposed at a central portion of said first electrode inward of said peripheral portion of said first electrode.

5. The plasma etching apparatus according to claim 3, wherein
   said section of higher electrode density constitutes a first section of higher electrode density located at a peripheral portion of said first electrode;
   said first electrode further includes a second section of higher electrode density located inwardly of said first section of higher electrode density; and
   said section of lower electrode density is located inwardly of said first section of higher electrode density and outwardly of said second section of higher electrode density.

6. The plasma etching apparatus according to claim 3, wherein
   said second electrode is formed in a disk shape; and
   said radio frequency transmission portions are constituted by radially extending openings formed through said disk-shaped second electrode in the thickness direction thereof.

7. The plasma etching apparatus according to claim 6, wherein
   said radially extending openings include a first set of radially extending openings extending a first distance inwardly from an outer periphery of said disk-shaped second electrode, and a second set of radially extending openings extending a second distance inwardly from the outer periphery of said disk-shaped second electrode, said second distance being shorter than said first distance.

8. The plasma etching apparatus according to claim 6, wherein
   said section of higher electrode density is disposed at a peripheral portion of said first electrode; and
   said section of lower electrode density is disposed at a central portion of said first electrode inward of said peripheral portion of said first electrode.

9. The plasma etching apparatus according to claim 3, wherein
   said second electrode comprises branch portions extending radially outwardly, said branch portions including main branch portions extending radially outwardly and sub branch portions respectively extending radially outwardly from said main branch portions; and
   said radio frequency transmission portions are constituted by openings between said branch portions.

10. The plasma etching apparatus according to claim 3, wherein
    said dielectric member comprises a disk-shaped dielectric member; and
    said recesses of said dielectric member include a first set of radially extending recesses, and a second set of radially extending recesses extending further radially inwardly than said first set of radially extending recesses.

11. The plasma etching apparatus according to claim 10, wherein
    said radially extending recesses of said first set of radially extending recesses alternate circumferentially with said radially extending recesses of said second set of radially extending recesses.

12. The plasma etching apparatus according to claim 11, wherein
    said second electrode is formed in a disk shape; and
    said radio frequency transmission portions are constituted by radially extending openings formed through said disk-shaped second electrode in the thickness direction thereof.

13. The plasma etching apparatus according to claim 10, wherein said second electrode is formed in a disk shape; and said radio frequency transmission portions are constituted by radially extending openings formed through said disk-shaped second electrode in the thickness direction thereof.

14. The plasma etching apparatus according to claim 3, wherein said recess portions are formed in an upper surface of said dielectric member; and said first electrode partly enters into said recess portions.

15. The plasma etching apparatus according to claim 3, wherein said at least one coil is branched into multiple coil lines from a center expanding outwardly.

16. The plasma etching apparatus according to claim 3, wherein said at least one coil comprises a large-diameter coil and a small-diameter coil smaller in diameter than said large diameter coil, each of said large and small-diameter coils branch into multiple coil lines from a center expanding outwardly.

17. The plasma etching apparatus according to claim 3, wherein said at least one coil is arranged with a center portion thereof disposed higher than an outer peripheral portion thereof.

18. The plasma etching apparatus according to claim 3, wherein said dielectric member comprises a disk-shaped dielectric member;

said recesses of said dielectric member include a first set of radially extending recesses, and a second set of radially extending recesses that alternate circumferentially with said first set of radially extending recesses; and wherein said first set of radially extending recesses includes only recesses formed in an outer peripheral annular portion of said disk-shaped dielectric member, and said second set of radially extending recesses includes both outer recesses formed in said outer peripheral annular portion of said disk-shaped dielectric member and inner recesses formed in an inner peripheral annular portion of said disk-shaped dielectric member located inwardly of said outer peripheral annular portion, said inner recesses being respectively radially aligned with said outer recesses.

* * * * *